United States Patent
Kawashima et al.

(10) Patent No.: US 7,772,125 B2
(45) Date of Patent: Aug. 10, 2010

(54) STRUCTURE IN WHICH CYLINDRICAL MICROSTRUCTURE IS MAINTAINED IN ANISOTROPIC GROOVE, METHOD FOR FABRICATING THE SAME, AND SEMICONDUCTOR DEVICE, TFT DRIVING CIRCUIT, PANEL, DISPLAY AND SENSOR USING THE STRUCTURE IN WHICH CYLINDRICAL MICROSTRUCTURE IS MAINTAINED IN ANISOTROPIC GROOVE

(75) Inventors: Takahiro Kawashima, Osaka (JP); Tohru Saitoh, Osaka (JP); Norihisa Mino, Osaka (JP)

(73) Assignee: Panasonic Corporation, Osaka (JP)

( * ) Notice: Subject to any disclaimer, the term of this patent is extended or adjusted under 35 U.S.C. 154(b) by 710 days.

(21) Appl. No.: 11/631,284

(22) PCT Filed: Feb. 8, 2006

(86) PCT No.: PCT/JP2006/030218

§ 371 (c)(1),
(2), (4) Date: Jan. 3, 2007

(87) PCT Pub. No.: WO2006/008559

PCT Pub. Date: Aug. 17, 2006

(65) Prior Publication Data

US 2008/0303029 A1    Dec. 11, 2008

(30) Foreign Application Priority Data

Feb. 10, 2005    (JP)    ............................. 2005-033962

(51) Int. Cl.
*H01L 21/00*    (2006.01)

(52) U.S. Cl. ........................ 438/701; 438/700; 977/882

(58) Field of Classification Search .......... 257/E29.245; 977/717, 721, 763, 882, 883, 890, 892, 893; 438/700, 701

See application file for complete search history.

(56) References Cited

U.S. PATENT DOCUMENTS 6,368,569 B1 *   4/2002   Haddon et al. ............... 423/460
6,403,397 B1 *   6/2002   Katz ........................... 438/99

(Continued)

FOREIGN PATENT DOCUMENTS

JP    2004-71654 A    3/2004

(Continued)

OTHER PUBLICATIONS

Liu et al. "Controlled deposition of individual single-walled carbon nanotubes on chemically functionalized templates"; Chemical Physics Letters 303 (1999) 125-129.*

(Continued)

*Primary Examiner*—Matthew C Landau
*Assistant Examiner*—Daren Wolverton
(74) *Attorney, Agent, or Firm*—McDermott Will & Emery LLP

(57) ABSTRACT

A method for fabricating a structure according to the present invention includes the steps of: forming a groove in a substrate, dropping a solution in which microstructures such as nanowires are dispersed into the groove and the step of evaporating the solution to arrange the microstructures in the groove in a self-organizing manner.

20 Claims, 19 Drawing Sheets

U.S. PATENT DOCUMENTS

| | | | |
|---|---|---|---|
| 6,872,645 | B2 | 3/2005 | Duan et al. |
| 6,887,450 | B2 | 5/2005 | Chen et al. |
| 6,891,227 | B2 | 5/2005 | Appenzeller et al. |
| 2003/0089899 | A1 | 5/2003 | Lieber et al. |
| 2003/0178617 | A1* | 9/2003 | Appenzeller et al. .......... 257/20 |
| 2004/0023514 | A1 | 2/2004 | Moriya et al. |
| 2004/0188721 | A1* | 9/2004 | Lieber et al. ................ 257/211 |
| 2005/0056828 | A1* | 3/2005 | Wada et al. ................... 257/40 |
| 2005/0057151 | A1* | 3/2005 | Kuwabara .................. 313/506 |
| 2005/0189859 | A1 | 9/2005 | Tsuruoka et al. |
| 2005/0214661 | A1 | 9/2005 | Stasiak et al. |
| 2005/0225252 | A1* | 10/2005 | Ito .......................... 315/169.3 |

FOREIGN PATENT DOCUMENTS

| | | |
|---|---|---|
| JP | 2004-98246 A | 4/2004 |
| JP | 2004-122283 A | 4/2004 |
| JP | 2005-075711 A | 3/2005 |
| JP | 2005-125428 A | 5/2005 |
| JP | 2005-169614 A | 6/2005 |
| JP | 2005-271198 A | 10/2005 |
| WO | WO 02/17362 A2 | 2/2002 |
| WO | WO 02/063693 A1 | 8/2002 |
| WO | WO/03/091982 * | 11/2003 |
| WO | WO/2004/006337 * | 1/2004 |

OTHER PUBLICATIONS

O'Connell et al. "Reversible water-solubilization of single-walled carbon nanotubes by polymer wrapping"; Chemical Physics Letters 342 (2001) 265-271.*

Bertness et al. "Nanowire Placement with Ink Jet Heads"; Society for Imaging Science and Technology; Sep. 2007; 23rd International Conference on Digital Printing Technologies and Digital Fabrication 2007; p. 836-838.*

Sekitani et al. "Organic tranistors manufactured using inkjet technology with subfemtoliter accuracy"; Apr. 1, 2008; PNAS; vol. 105, No. 13; p. 4976-4980.*

Rueckes, T., et al. "Carbon Nanotube-Based Nonvolatile Random Access Memory for Molecular Computing" Science, Jul. 7, 2000, vol. 289, pp. 94-97.

Wang, D., et al. "Germanium Nanowire Field-Effect Transistors with $SiO_2$ and high-$_K$ $HfO_2$ Gate Dielectrics" Applied Physics Letters, Sep. 22, 2003, vol. 83, No. 12, pp. 2432-2434.

Zhang, Y., et al. "Electric-Field-Directed Growth of Aligned Single-Walled Carbon Nanotubes" Applied Physics Letters, Nov. 5, 2001, vol. 79, No. 19, pp. 3155-3157.

Huang, Y., et al. "Directed Assembly of One-Dimensional Nanostructures into Functional Networks" Science, Jan. 26, 2001, vol. 291, pp. 630-633.

* cited by examiner

A : Length of groove in the transverse direction
B : Length of groove in the longitudinal direction
L : Length of nanowire Location relationship between nanowire and groove
$L > A$ and $L < B$

STRUCTURE IN WHICH CYLINDRICAL MICROSTRUCTURE IS MAINTAINED IN ANISOTROPIC GROOVE, METHOD FOR FABRICATING THE SAME, AND SEMICONDUCTOR DEVICE, TFT DRIVING CIRCUIT, PANEL, DISPLAY AND SENSOR USING THE STRUCTURE IN WHICH CYLINDRICAL MICROSTRUCTURE IS MAINTAINED IN ANISOTROPIC GROOVE

RELATED APPLICATIONS

This application is a national phase of PCT/JP2006/302180 filed Feb. 8, 2006, which claims priority from Japanese Application No. 2005-033962 filed Feb. 10, 2005, the disclosures of which Applications are incorporated by reference herein. The benefit of the filing and priority dates of the International and Japanese Applications is respectfully requested.

TECHNICAL FIELD

The present invention relates to a structure for holding a microstructure. More particularly, the present invention relates to a method for arranging a microstructure such as a nanowire or a nanotube in a groove formed in a substrate and a structure fabricated according to the method.

BACKGROUND ART

A transistor in a large scale integrated (LSI) circuit and a thin film transistor (TFT) in a flat panel display and the like are all field-effect transistors (FETs). The performance of FETs has been improved by reduction in size of each element. In silicon semiconductor processes, micromachining with a minimum dimension of 0.1 µm or less has been realized by reduction in wavelength of a light source of exposure light used in photolithography.

However, size reduction by photolithography has come close to its limitation. In addition, prices of exposure equipment and photomasks have been increased.

In recent years, techniques for fabricating an electronic device by using a carbon nanotube (CNT), a semiconductor nanowire or the like have drawn attention. A CNT, a nanowire or the like has a micropillar structure having a diameter of several nm, and leaves the possibility of realizing electrical devices in the nanometer size. The operation of a non-volatile memory using a CNT has been reported (see Non-Patent Reference 1). Also, the operation of a transistor using a nanowire at room temperature has been reported (see Non-Patent Reference 2). To put those electric devices into practical use, an arrangement position, an arrangement direction, a diameter and an arrangement density of a CNT or a nanowire need to be controlled. As a method for controlling an arrangement position and an arrangement direction, a method for controlling an arrangement direction of a CNT using an electric field (see Non-Patent Reference 3), a method for forming a fluid flow channel using a mold made of polydimethyl siloxane (PDMS) (i.e., flow method, see Non-Patent Reference 4) and the like have been reported.

Non-Patent Reference 1: T. Rueckers, et al., "Carbon Nanotube-Based Nonvolatile Random Access Memory for Molecular Computing," Science vol. 289 pp. 94, 2000

Non-Patent Reference 2: D. Wang, et al., "Germanium nanowire field-effect transistors with SiO2 and high-k HfO2 gate dielectric," Appl. Phys. Lett. Vol. 83 pp. 2432, 2003

Non-Patent Reference 3: Y. Zhang, et al., "Electric-field-directed growth of aligned single-walled carbon nanotubes," Appl. Phys. Lett. Vol. 79 pp. 3155, 2001

Non-Patent Reference 4: Y. Huang, et al., "Directed Assembly of One-Dimensional Nanostructure into Functional Networks," Science vol. 291 pp. 630, 2001

DISCLOSURE OF INVENTION

Problems that the Invention is to Solve

However, it is difficult to form a stable arrangement on a substrate having a large area by the above-described methods for controlling an arrangement position and an arrangement direction, and thus it is hard to push the above-described methods to industrial applications. Moreover, process steps become complicated and accordingly complicated facilities become necessary. This leads increase in costs.

In view of the above-described problem, it is therefore an object of the present invention to provide a method for arranging a nanowire or a nanotube on a substrate having a large area by simple process steps.

Solution to the Problems

A method for fabricating a structure for holding a microstructure according to the present invention is characterized by comprising the steps of: a) supplying a fluid containing a microstructure having a cylindrical shape in at least one anisotropic groove provided on a substrate; and b) evaporating the fluid so that the microstructure is arranged so as to extend in a longitudinal direction of said at least one groove. Herein, a "microstructure" specifically means to be a nanotube, a nanowire, a nanorod, a nanoribbon or the like. Also, a "cylindrical shape" includes a tube-like shape having a hollow therein. Moreover, a cylindrical shape does not have to strictly mean to be the shape of a cylinder but includes a shape like a polyangular pillar, a shape like a cylindrical pillar of which a part is lacked and the like. To be "anisotropic" specifically means that a planar shape differs depending on directions. To "arrange a microstructure or the like in a longitudinal direction" not only means to arrange a microstructure or the like in parallel to the longitudinal direction but also means to arrange it in a direction tilted from the longitudinal direction. In such a case, an angle tilted from the longitudinal direction has to be smaller than an angle tilted from a vertical direction to the longitudinal direction.

According to the fabrication method of the present invention, a microstructure can be stably arranged even on a substrate having a large area. Thus, a structure for holding a microstructure can be fabricated in an industrial scale. Moreover, this method is simple and does not require complicated equipment. Therefore, a structure for holding a microstructure can be fabricated at low cost.

The method for fabricating a structure for holding a microstructure according to the present invention may further include, before the step a), the step c) of forming said at least one groove.

It is preferable that the method for fabricating a structure for holding a microstructure according to the present invention further includes, after the step c) and before the step a), the step d) of increasing an affinity with respect to the fluid in a surface of said at least one groove to a higher level than an affinity in a surface of the substrate excluding part of the substrate in which said at least one groove is formed. In such a case, in the step b), the fluid can easily fit in the groove.

In the method for fabricating a structure for holding a microstructure according to the present invention, in the step d), the affinity with respect to the fluid may be increased in the surface of said at least one groove to a higher level than the affinity in the surface of the substrate excluding the part of the substrate in which said at least one groove is formed by covering, with a coating film, part of the substrate excluding the part of the substrate in which said at least one groove is formed.

In the method for fabricating a structure for holding a microstructure according to the present invention, in the step d), the affinity with respect to the fluid may be increased in the surface of said at least one groove to a higher level than the affinity in the surface of the substrate excluding the part of the substrate in which said at least one groove is formed by covering, with a coating film, the part of the surface of the substrate in which said at least one groove is formed.

In the method for fabricating a structure for holding a microstructure according to the present invention, in the step d), the affinity with respect to the fluid may be increased in the surface of said at least one groove to a higher level than the affinity in the surface of the substrate excluding part of the substrate in which said at least one groove is formed by covering, with a first coating film, the part of the substrate in which said at least one groove is formed and covering, with a second coating film, the part of the substrate excluding the part of the substrate in which said at least one groove is formed.

In the method for fabricating a structure for holding a microstructure according to the present invention, in the step a), the fluid is supplied using nanolithography. In such a case, even in a substrate having a large area, a proper amount of the fluid can be supplied to a proper location.

As a specific example for nanolithography, an inkjet technique can be used.

In the method for fabricating a structure for holding a microstructure according to the present invention, in the step c), said at least one groove may be formed using imprint lithography. In such a case, a fine groove can be formed in a simple manner.

A method for fabricating a semiconductor device includes the inventive method for fabricating a structure for holding a microstructure according to the present invention may further include the step e) of forming a first electrode and a second electrode which are to be connected to the microstructure.

In the method for fabricating a semiconductor device according to the present invention, in the step e), a source electrode is formed as the first electrode and a drain electrode is formed as the second electrode, and the method may further include the steps of: forming a gate insulating film for covering the microstructure on the substrate; and forming a gate electrode on the gate insulating film.

A method for fabricating a sensor according to the present invention includes the method for fabricating a structure including a microstructure according to the present invention. In the inventive method for fabricating a sensor, the substrate may be an insulating substrate, and the method may further include the step of forming a first electrode and a second electrode which are to be connected to the microstructure.

The inventive method for fabricating a sensor may further include the step of chemically modifying a surface of the microstructure.

A structure for holding a microstructure according to the present invention is characterized by including: a substrate having at least one anisotropic groove; and a microstructure having a cylindrical shape arranged so as to extend in a longitudinal direction of said at least one groove.

The structure for holding a microstructure according to the present invention can be obtained by supplying a fluid containing a microstructure into a groove and then evaporating the fluid so that a microstructure is arranged in a self-aligning manner. According to this method, a microstructure can be stably arranged even on a substrate having a large area. Thus, a structure for holing a microstructure can be fabricated in an industrial scale. Moreover, this method is simple and does not require complicated equipment. Therefore, the structure for holding a microstructure can be formed at low cost.

In the structure for holding a microstructure according to the present invention, it is preferable that a diameter of the microstructure is smaller than a depth of said at least one groove. In such a case, the structure can be easily fit in the groove.

In the structure for holding a microstructure according to the present invention, it is preferable that a length of said at least one groove in the longitudinal direction (if the length is not uniform, a maximum length) is larger than a length of the microstructure and a length of said at least one groove in a vertical direction to the longitudinal direction (if the length is not uniform, a minimum length) is smaller than the length of the microstructure. With the above-described dimensions of the groove, the microstructure is arranged in the longitudinal direction of the groove in a self-organizing manner.

In the structure for holding a microstructure according to the present invention, the microstructure may be provided plural in number.

In the structure for holding a microstructure according to the present invention, it is preferable that a length of said at least one groove in a vertical direction to the longitudinal direction is increased at a shallower portion of said at least one groove. In such a case, the structure can be easily fit in the groove.

In the structure for holding a microstructure according to the present invention, it is preferable that a deepest portion of said at least one groove extends in the longitudinal direction of said at least one groove. In such a case, the microstructure can be arranged along the deepest portion. Note that a "deepest portion" is not necessarily located at the deepest point of the groove. That is, when the groove has a plurality of trench portions, a deepest portion is a portion of each trench located at the deepest point (minimum portion) of the trench.

In the structure for holding a microstructure according to the present invention, a cross-sectional shape of said at least one groove in a vertical direction to the longitudinal direction may have a V shape, a U shape or a rectangular shape.

In the structure for holding a microstructure according to the present invention, it is preferable that an affinity with respect to a fluid is higher in a surface of said at least one groove than in a surface of the substrate excluding the surface of said at least one groove. In such a case, when a fluid containing a microstructure is supplied to the groove, the fluid can easily fit in the groove.

Specifically, if part of the substrate excluding said at least one groove is covered with a coating film, and the affinity with respect to the fluid is lower in the coating film than in the surface of said at least one groove, the affinity with respect to the fluid in the groove can be relatively increased. Note that the coating film preferably has a nanometer film thickness. A "nanometer film thickness" means to be a thickness in terms of nanometer unit and, specifically, a value of about 1-100 nm.

The coating film may be a monomolecular film. The fluid may be water, and the affinity may be a hydrophilic property. The fluid may be lipid, and the affinity may be a lipophilic property.

Also, if part of the substrate in which said at least one groove is formed is covered with a coating film, and the affinity with respect to the fluid is higher in the coating film than in the surface in the surface of the substrate excluding the surface of said at least one groove, the affinity with respect to the fluid in the groove can be relatively increased. Note that the coating film preferably has a nanometer film thickness. A "nanometer film thickness" means to be a thickness in terms of nanometer unit and, specifically, a value of about 1-100 nm.

The coating film may be a monomolecular film. The fluid may be water, and the affinity may be a hydrophilic property. The fluid may be lipid, and the affinity may be a lipophilic property.

In the structure for holding a microstructure according to the present invention, part of the substrate in which said at least one groove is formed may be covered with a first coating film, part of the substrate excluding said at least one groove may be covered with a second coating film, and the first coating film may have a higher affinity with respect to the fluid than an affinity of the second coating film.

Each of the first coating film and the second coating film may be a monomolecular film.

The fluid may be water, and the affinity may be a hydrophilic property. In such a case, the first coating film may be a silicon oxide film, and the second coating film may be a silicon nitride film. Alternatively, the first coating film may be $NH_2(CH_2)_nSi(OCH_3)_3$, $COOH(CH_2)_nSi(OCH_3)_3$, $NH_2(CH_2)_nSH$ or $COOH(CH_2)_nSH$, and the second coating film may be $CF_3(CF_2)_n(C_2H_4)_mCOOH$, $CF_3(CF_2)_n(C_2H_4)_mNH_2$, $CF_3(CF_2)_n(C_2H_4)_mOH$, $CF_3(CF_2)_n(C_2H_4)_mSiCl_3$ or $CF_3(CF_2)_n(C_2H_4)_m(SiOCH_3)_3$.

The fluid may be lipid, and the affinity may be a lipophilic property. In such a case, the first coating film may be a silicon nitride film, and the second coating film may be a silicon oxide film. Alternatively, the first coating film may be $CF_3(CF_2)_n(C_2H_4)_mCOOH$, $CF_3(CF_2)_n(C_2H_4)_mNH_2$, $CF_3(CF_2)_n(C_2H_4)_mOH$, $CF_3(CF_2)_n(C_2H_4)_mSiCl_3$ or $CF_3(CF_2)_n(C_2H_4)_m(SiOCH_3)_3$, and the second coating film may be $NH_2(CH_2)_nSi(OCH_3)_3$, $COOH(CH_2)_nSi(OCH_3)_3$, $NH_2(CH_2)_nSH$ or $COOH(CH_2)_nSH$.

In the structure for holding a microstructure according to the present invention, the substrate may be formed of a material selected from the group consisting of a polymer material, an inorganic material and a compound material of a polymer material and an inorganic material.

The structure for holding a microstructure according to the present invention is applicable to various kinds of semiconductor devices. In such a case, the microstructure connects a first electrode and a second electrode.

More specifically, when a semiconductor device to which the structure is applied is a MOSFET, the first electrode may be a source electrode, the second electrode may be a drain electrode, the source electrode and the drain electrode may be formed on the substrate, and the semiconductor device may further include a gate insulating film formed in part of the substrate located between the source electrode and the drain electrode and covering the microstructure, and a gate electrode formed on the gate insulating film.

When a semiconductor device to which the structure is applied is a bipolar transistor, an emitter electrode and a collector electrode are connected.

When a semiconductor device to which the structure is applied is a resistor, a first electrode and a second electrode are electrically connected.

Moreover, a TFT driving circuit including a semiconductor device according to the present invention may further include a source electrode line connected to the source electrode, a gate electrode line connected to the gate electrode, and a pixel electrode connected to the drain electrode. Conventionally, a transistor made of an organic material such as a plastic has been developed as a TFT driving circuit but there has been a problem in which a driving power of such a transistor is low. However, in the semiconductor device of the present invention, a high driving power can be achieved using a plastic substrate. Therefore, when the semiconductor device of the present invention is used as a TFT driving circuit, excellent effects can be achieved.

The TFT driving circuit of the present invention can be used for a panel or a display. In a panel according to the present invention, the substrate may be a plastic substrate, the TFT driving circuit may be provided plural in number so that the plurality of the TFT driving circuits are arranged on the plastic substrate in a matrix, and the panel may further include an EL layer formed on the plastic substrate, and a transparent electrode formed on the EL layer.

Moreover, the structure for holding a microstructure according to the present invention is applicable to various kinds of interconnects. In such a case, the microstructure is an interconnect formed of a conductor.

The structure for holding a microstructure according to the present invention is applicable to a sensor. In a sensor according to the present invention, the substrate may be an insulating substrate, the sensor may further include a first electrode and a second electrode formed on the insulating substrate, and the microstructure may connect the first electrode and the second electrode. In the sensor, a surface of the microstructure may be chemically modified.

EFFECTS OF THE INVENTION

According to the present invention, a structure for holding a microstructure can be fabricated at low cost and in an industrial scale.

BRIEF DESCRIPTION OF DRAWINGS

FIG. 1(*b*) is a cross-sectional view taken along the line A-A' of FIG. 1(*a*).

FIG. 6(*b*) is a cross-sectional view taken along the line D-D' of FIG. 6(*a*).

FIG. 10(*b*) is a cross-sectional view taken along the line G-G' of FIG. 10(*a*).

FIG. 12(*b*) is a cross-sectional view taken along the line I-I' of FIG. 12(*b*).

FIG. 17(*b*) is a cross-sectional view taken along the line II-II'.

EXPLANATION OF REFERENCE NUMERALS

Figure 1A:
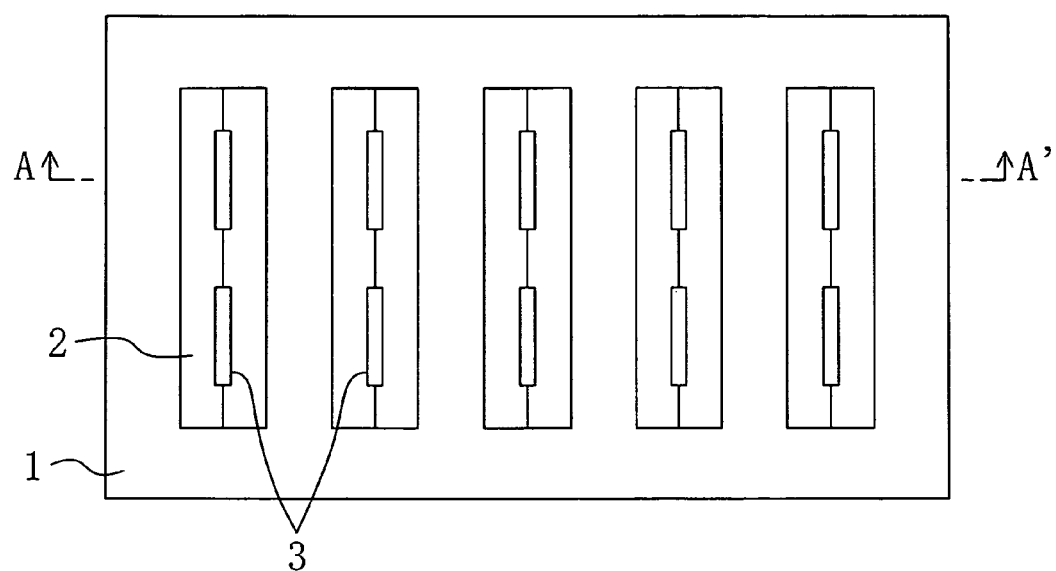
FIG. 1(*a*) is a schematic plan view illustrating an embodiment of a structure for holding a microstructure according to the present invention.

1. Substrate
2. Groove
3. Microstructure
4. Deepest portion
4'. Deepest portion
5. Mask component
6. Microstructure disperse solution
10. Silicon substrate
11. Hydrophilic film
12. Nanowire
13. V-shaped groove
14. Hydrophobic film
15. Nanowire disperse solution
16. Plastic substrate
17. Hydrophilic film
18. Pyramid indenter
19. Nanowire
20, 21. Electrode
22. Channel region
23. Gate electrode
24. Gate insulating film
25. Deepest portion
31. Groove
32. Nanowire
33. Electrode
34. Electrode
50. Substrate
51. Source electrode line
52. Gate electrode line
53. Insulating film
54. TFT
55. Pixel electrode
56. Source electrode
57. Drain electrode
58. Gate insulating film
59. Gate electrode
61. TFT driving circuit
62. Plastic substrate
63. Organic EL layer
64. Transparent electrode
65. Protective film
66. Gate electrode line
67. Source electrode line

BEST MODE FOR CARRYING OUT THE INVENTION

Structure for Holding Microstructure

Figure 1B:
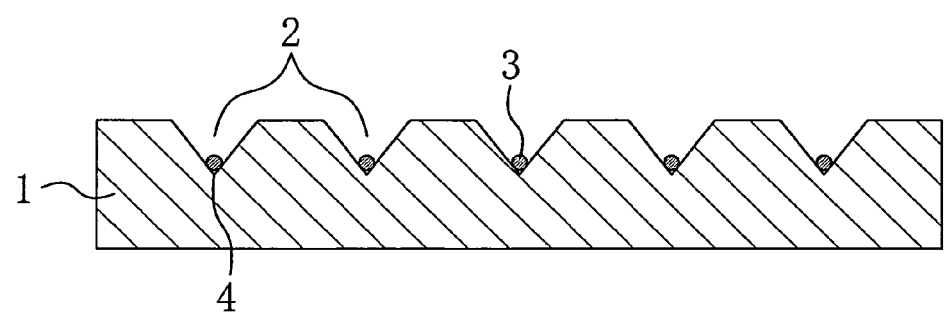
Figure 2A:
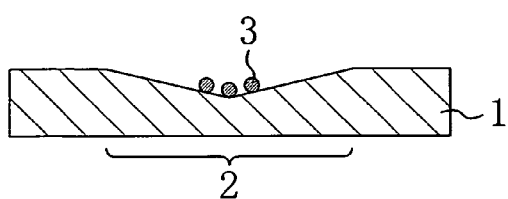
FIGS. 2(*a*) and 2(*f*) are cross-sectional views illustrating exemplary shapes for a groove according to the present invention.
Figure 2B:
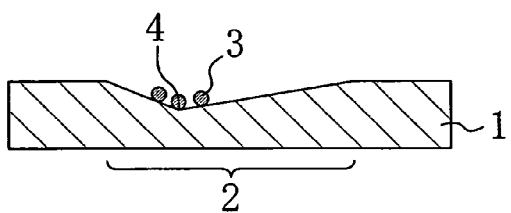
Figure 2C:
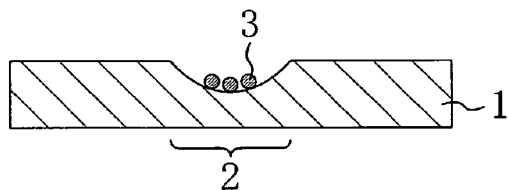
Figure 2D:
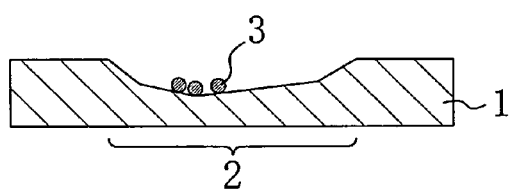
Figure 2E:
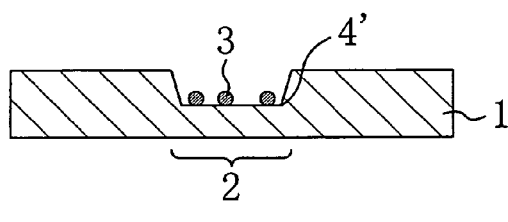
Figure 2F:
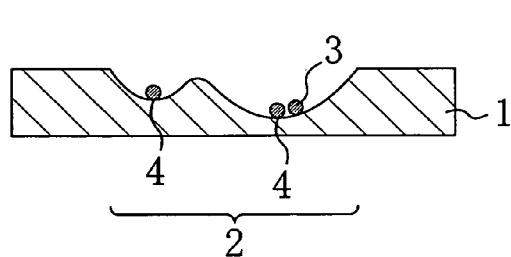

Hereafter, a basic configuration of a structure according to the present invention will be described with reference to FIG. 1. FIG. 1(*a*) is a plan view schematically illustrating an embodiment of a structure for holding a microstructure according to the present invention. FIG. 1(*b*) is a cross-sectional view taken along the line A-A'.

The structure for holding a microstructure shown in FIGS. 1(*a*) and 1(*b*) includes a substrate 1, a plurality of grooves 2 provided on the substrate 1 so as to be spaced away from one another and microstructures 3 arranged in the grooves 2. The microstructures 3 are, specifically, nanowires, nanotubes, nanorods, nanoribbon or the like.

Each of the microstructures 3 is placed so as to extend in the longitudinal direction (i.e., the vertical direction to the line A-A' of FIG. 1) of the grooves 2. It is preferable that a cross-sectional shape of each of the grooves 2 is a V-shape, as shown in FIG. 1(*b*), and a surface of each of the grooves 2 has a deepest portion 4 where the depth of the groove is maximum, as shown in FIG. 1(*a*). In this manner, an arrangement direction of each of the microstructures 3 in the grooves 2 can be made so that each of the microstructures 3 extends along the deepest portion 4.

As a matter of course, the shape of each of the grooves 2 is not limited to the shape shown in FIGS. 1(*a*) and 1(*b*) but each of the grooves 2 may have a cross-sectional shape shown in FIGS. 2(*a*) through 2(*f*) or a planar shape of FIGS. 3(*a*) through 3(*d*). FIGS. 2(*a*) through 2(*f*) are cross-sectional views illustrating exemplary shapes for a groove according to the present invention. FIGS. 3(*a*) through 3(*d*) are plan views illustrating exemplary shapes for a groove according to the present invention. Specifically, each of the grooves 2 may have a V-shaped cross section with gentle slopes, as shown in FIG. 2(*a*), or a V-shaped cross section with the deepest portion 4 shifted in the left or right direction, as shown in FIG. 2(*b*). Also, each of the grooves 2 may have a U shape cross section, as shown in FIG. 2(*c*), or a polyangular cross section, as shown in FIG. 2(*d*). Furthermore, each of the grooves 2 may have a cross section of a trench type with a deepest portion 4' with a width, as shown in FIG. 2(e), or a cross section with a plurality of deepest portions 4, as shown in FIG. 2(f).

Figure 3A:
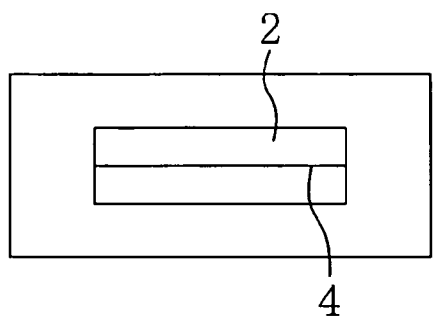
FIGS. 3(*a*) through 3(*d*) are plan views illustrating exemplary shapes for a groove according to the present invention.
Figure 3B:
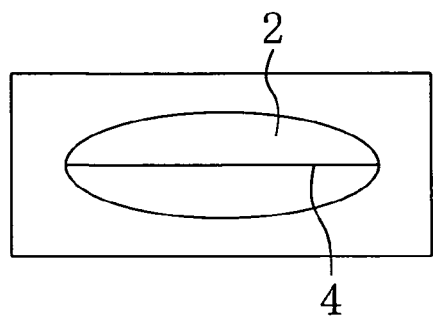
Figure 3C:
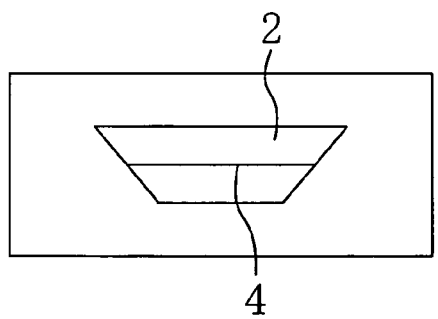
Figure 3D:
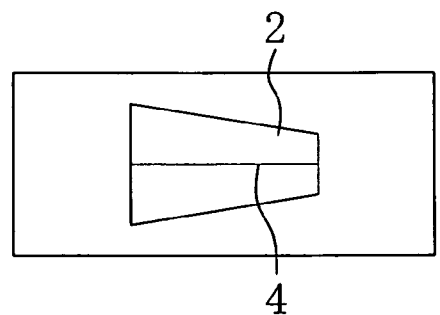

Each of the grooves 2 may have a rectangular planar view, as shown in FIG. 3(a), or an oval planar shape, as shown in FIG. 3(b). Note that the planar shape of each of the grooves 2 may be an anisotropic planar shape with rounded corners, other than the oval shape of FIG. 3(b). Each of the grooves 2 may have a longitudinally symmetric planar shape, as shown in FIG. 3(c), or a vertically symmetric planar shape (i.e., a symmetric shape with respect to the deepest portion 4), as shown in FIG. 3(d). Also, the planar shape of each of the grooves 2 may be asymmetric. That is, the planar shape of each of the grooves 2 only has to be anisotropic and the direction in which the microstructures 3 are arranged is determined in a self-aligning manner according to the planar shape of each of the grooves 2.

(Fabrication Method)

The structure for holding a microstructure according to the present invention can be formed by applying a solution including dispersed microstructures onto groove portions on a substrate and arranging nanowires in a self-organizing manner in the longitude direction of grooves by force (for example, lateral capillary force) generated when a solvent is evaporated. Hereafter, a basic method for the above-described formation will be described. FIGS. 4(a) through 4(d) are cross-sectional views illustrating respective steps for fabricating the structure for holding a microstructure according to the present invention. According to the fabrication method of the present invention, first, in a process step shown in FIG. 4(a), a mask component 5 is formed on a substrate 1 and openings are formed so as to correspond to regions of the substrate 1 in which grooves 2 are to be formed (shown in FIG. 4(b)).

Figure 4A:
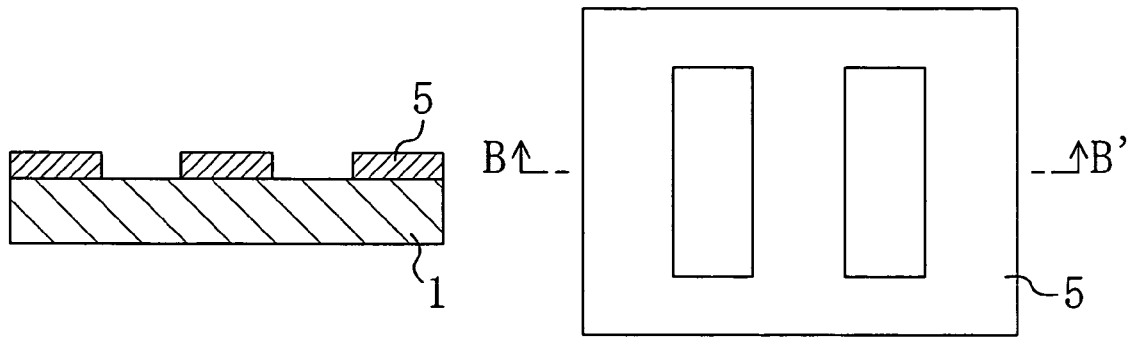
FIGS. 4(*a*) through 4(*d*) are cross-sectional views illustrating respective steps for fabricating a structure for holding a microstructure according to the present invention.
Figure 4B:
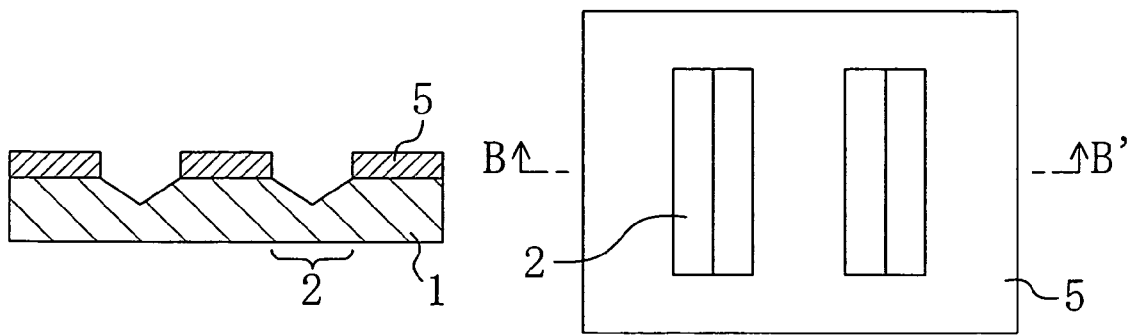

Next, in a process step shown in FIG. 4(b), respective parts of the substrate 1 exposed through the openings are removed, thereby forming anisotropic grooves 2.

Figure 4C:
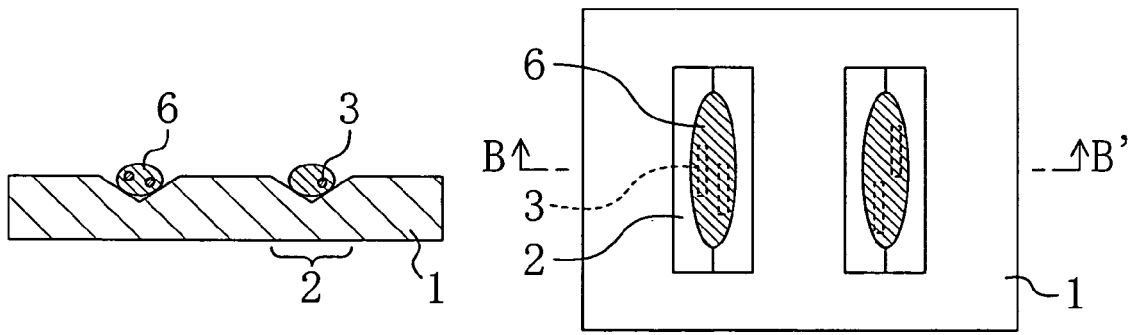

Next, in a process step shown in FIG. 4(c), the mask component 5 is removed and a microstructure disperse solution 6 including dispersed microstructures 3 is dropped into the grooves 2. Note that removal of the mask component 5 is not always necessary. The microstructure disperse solution 6 is formed by forming microstructures, collecting the microstructures and then dispersing the microstructures in a solvent.

Figure 4D:
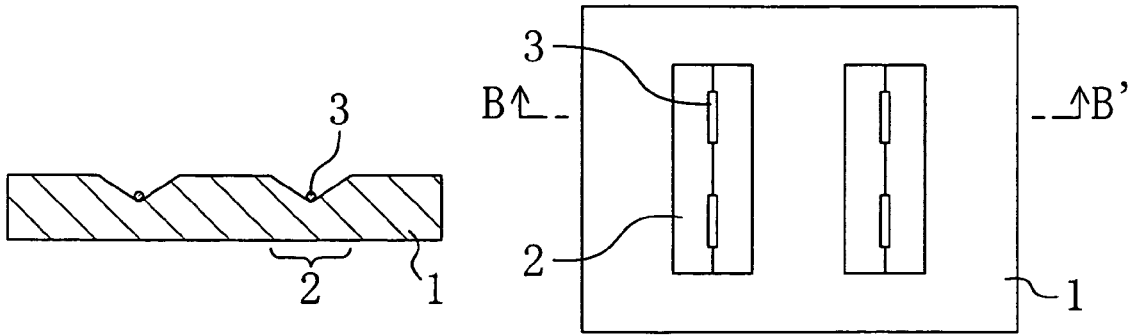

Next, in a process step shown in FIG. 4(d), the microstructure disperse solution 6 is evaporated. Thus, the microstructures 3 are arranged in a self-aligning manner so that a longitudinal direction of the microstructures 3 is substantially parallel to a longitudinal direction of the grooves 2.

Figure 5A:
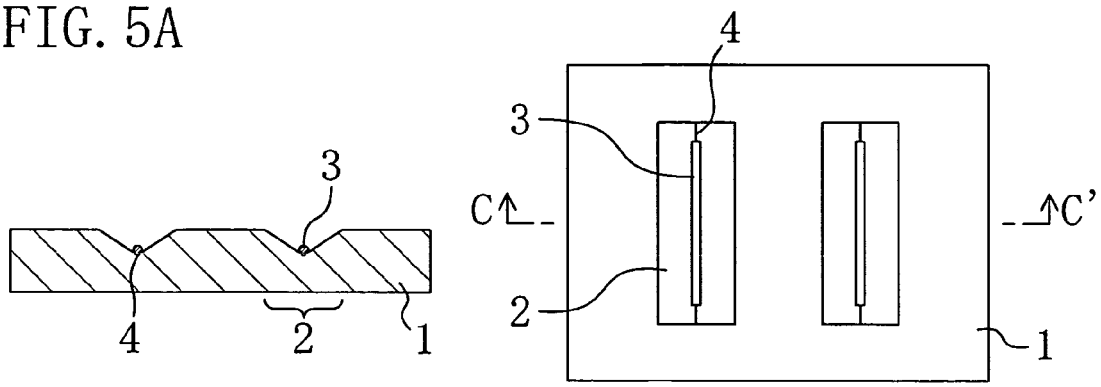
FIGS. 5(*a*) through 5(*c*) are cross-sectional and plan views illustrating exemplary arrangements for a microstructure in a groove.
Figure 5B:
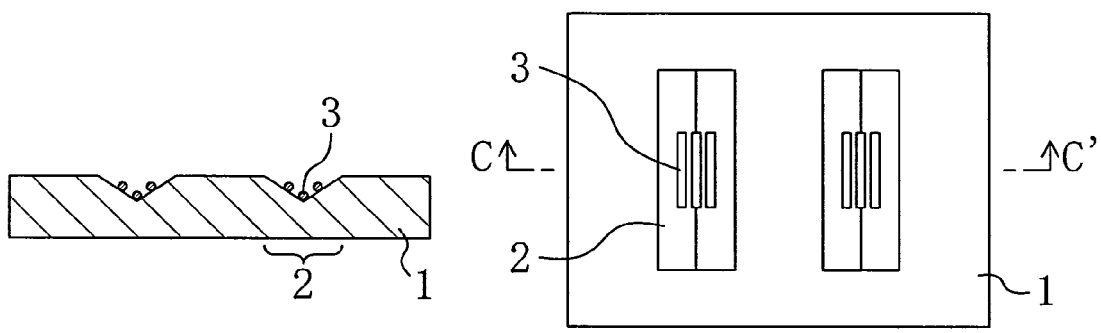
Figure 5C:
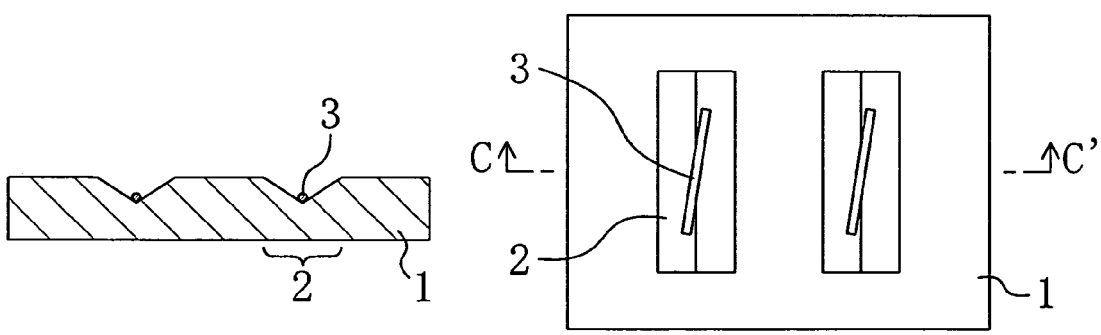

FIGS. 5(a) through 5(c) are cross-sectional and plan views illustrating exemplary arrangements for a microstructure in a groove. As shown in FIGS. 5(a) and 5(b), the microstructures 3 are preferably arranged so that each of the microstructures 3 extends along a deepest portion 4 of an associated one of the grooves 2. However, the direction in which each of the microstructures 3 extends and the direction in which the deepest portion 4 extends do not have to match one another. That is, as shown in FIG. 5(c), each of the microstructures 3 may extend in a direction tilted by a certain angle from the direction in which the deepest portion 4 extends.

The outline of the structure for holding a microstructure and a method for forming the structure have been described above. Hereafter, more detailed embodiments will be described. Note that in the following embodiments, the case where a microstructure is a nanowire will be described as an example.

First Embodiment

Figure 6A:
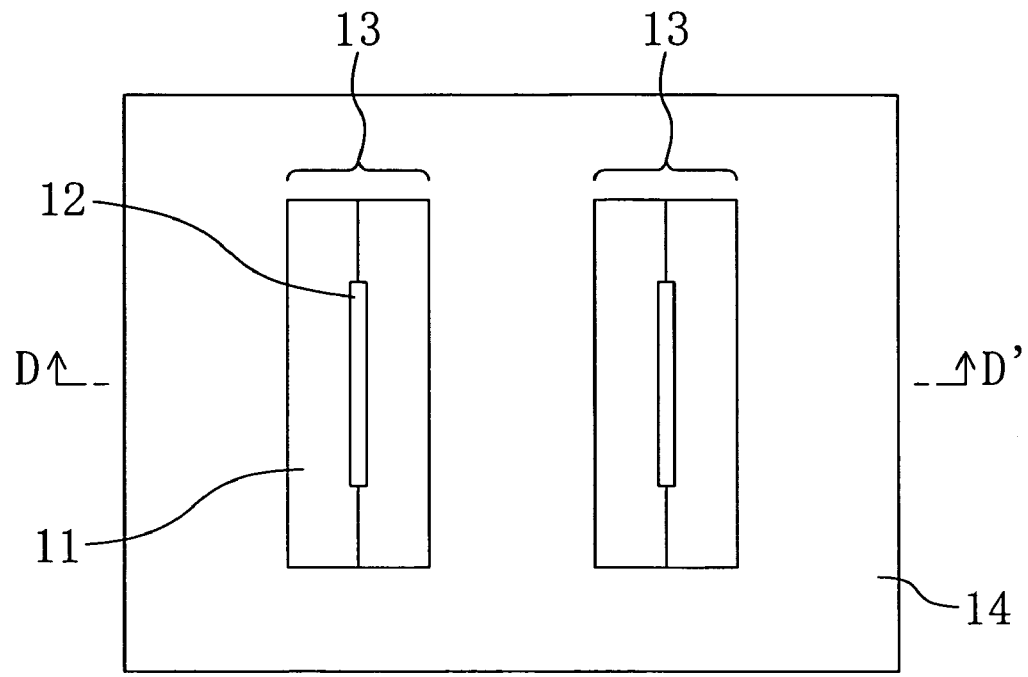
FIG. 6(*a*) is a plan view schematically illustrating a configuration of a structure for holding a microstructure according to the first embodiment.
Figure 6B:
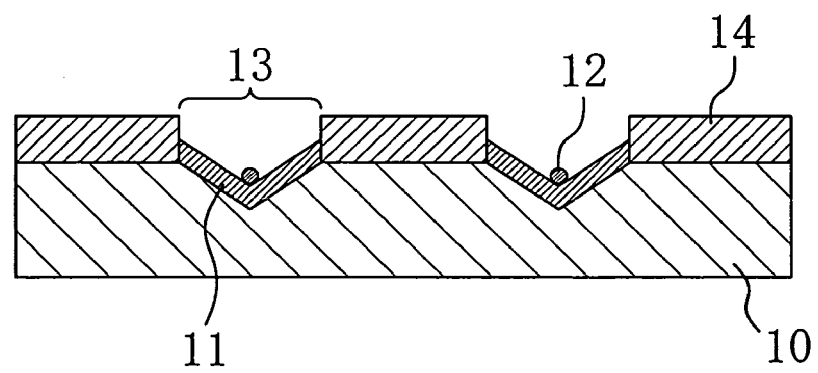

FIG. 6(a) is a plan view schematically illustrating a configuration of a structure for holding a microstructure according to the first embodiment. FIG. 6(b) is a cross-sectional view taken along the line D-D' of FIG. 6(a).

As shown in FIGS. 6(a) and 6(b), a structure for holding a microstructure according to this embodiment is a structure in which nanowires 12 are arranged in V-shaped grooves 13 formed on the silicon substrate 10, respectively. The nanowires 12 are arranged so as to extend along a longitudinal direction (the vertical direction to the line D-D' of the FIG. 6(a)) of the V-shaped grooves 13. Note that the nanowires 12 may be arranged so as to extend in a direction tilted from the longitudinal direction of the V-shaped grooves 13.

At least one V-shaped groove 13 is formed in arbitrary part of a silicon substrate 10. A surface of the V-shaped groove 13 is covered by a hydrophilic film 11 and other part of the silicon substrate 10 than the V-shaped groove 13 is covered by the hydrophobic film 14. A surface energy of the V-shaped groove 13 is preferably 40 dyne/cm or more and is more preferably 60 dyne/cm or more and 100 dyne/cm or less. A surface energy of the other part of the silicon substrate 10 than the V-shaped groove 13 is preferably 5 dyne/cm or more and 40 dyne/cm or less and is more preferably 5 dyne/cm or more and 25 dyne/cm or less.

As the hydrophilic film 11, for example, an oxide film is formed. The oxide film may be formed by film deposition using plasma CVD or the like or by oxidation of a surface of the silicon substrate 10 by corona discharge or plasma processing.

As a hydrophobic film 14, for example, a deposition hydrophobic film such as a silicon nitride film deposited by CVD is used. Moreover, when, instead of the silicon substrate 10, a substrate containing hydrogen is used, for example, a film obtained by performing plasma processing of fluorine gas to the substrate so that hydrogen is replaced with fluorine is used.

As the hydrophilic film 11, a film in nanometer order containing a chemical binding expressed by -Z-O— or -Z-N— (in this case, Z is Si, Ti or Al) is formed to control wettability. As a film containing such a chemical binding, for example, an organic molecule containing such a functional group expressed by the following general formula (Formula 1) is used.

[Formula 1]

In this case, Z is Si, Ti or Al. D is F, Cl, Br, I, OH, SCN, NCO or at least a type of atom group of alkoxysilane having a carbon number of 1 through 5. E is H or an atom group of alkoxysilane having a carbon number of 1 through 3. Each of q and r is an integer number of 1 through 3, and q+r is 3.

The hydrophobic film 14 may contain an organic molecule having a functional group expressed by a general formula of $CF_kH_l$. In this case, each of k and l is an integer number from 0 through 3 and k+l is 3.

As the hydrophilic film 11, $NH_2(CH_2)_nSi(OCH_3)_3$, $COOH(CH_2)_nSi(OCH_3)_3$, $NH_2(CH_2)_nSH$ or $COOH(CH_2)_nSH$ may be used.

As the hydrophobic film 14, $CF_3(CF_2)_n(C_2H_4)_mCOOH$, $CF_3(CF_2)_n(C_2H_4)_mNH_2$, $CF_3(CF_2)_n(C_2H_4)_mOH$, $CF_3(CF_2)_n(C_2H_4)_mSiCl_3$ or $CF_3(CF_2)_n(C_2H_4)_m(SiOCH_3)_3$ may be used.

The hydrophilic film 11 and the hydrophobic film 14 are not necessarily provided as necessary components of the structure of the present invention.

In this embodiment, the case where the silicon substrate 10 is used has been described. However, according to the present invention, as a substrate, an arbitrary substrate formed of an insulating material such as silicon oxide, titanium oxide, acryl resin, epoxy resin, polyimide or the like can be used. It is not necessary that the entire substrate is formed of a conductive film or an insulating film. Therefore, a SOI substrate or a compound semiconductor substrate can be also used.

Each of a transverse dimension of the V-shaped groove 13 (in the direction along the D-D' line) and a longitudinal dimension of the V-shaped groove 13 (in the vertical direction to the D-D line) is, for example, 100 nm or more and, more specifically is 1 µm to 50 µm. Each of the nanowires 12 has a diameter of 1 nm to 100 nm and a length of 500 nm to 100 µm.

The nanowires 12 can be formed of various different materials (for example, metal, semiconductor or an insulating material). In this embodiment, nanowires formed of silicon are used. Nanowires can be formed, for example, utilizing VLS (vapor-liquid-solid) growth mechanism. More specifically, nanowires can be grown by CVD using a catalyst metal. Using this method, nanowires having the same diameter and the same length can be grown by controlling a particle size and a growth time of a catalyst metal.

Catalyst metals suitable for silicon nanowire growth are, for example, transition metals such as gold, iron, cobalt and nickel and an alloy of such a transition metal. A catalyst metal can be formed in an arbitrary manner. For example, a catalyst metal formed by performing heat treatment to a catalyst metal thin film deposited on a substrate may be used. In this embodiment, the number of the nanowires 12 arranged in a single V-shaped groove 13 is, for example, about 1 to 1000.

In this embodiment, the nanowires 12 are arranged along bottom part of the V-shaped groove 13. Thus, with respect to the location and arrangement direction for the nanowires 12, a plurality of locations in the silicon substrate 10 can be defined by forming a plurality of V-shaped grooves 13 in arbitrary locations. The V-shaped grooves 13 can be formed by a process step used in known semiconductor processing (such as lithography and wet etching). Therefore, the arrangement direction of the nanowires 12 can be defined in a wide range without restrictions on an effective range of an external field (such as an electric filed and magnetic field).

In this embodiment, the case where the hydrophilic film 11 is formed in each of the V-shaped grooves 13 and the hydrophobic film 14 is formed outside the V-shaped grooves 13 has been described. In this case, if water is adopted as a nanowire disperse solution used in fabrication process steps, water can be selectively supplied into the V-shaped grooves 13. In the present invention, a lipophilic film may be formed in each of the V-shaped grooves 13 and a film having a lower lipophilic property may be formed outside the V-shaped grooves 13. In this case, using lipid as a nanowire disperse solution, lipid can be selectively supplied into the V-shaped grooves 13. Also, in such a case, hydrophilic and hydrophobic films having the above-described material properties can be also formed.

Hereafter, a fabrication method according to this embodiment will be described with reference to FIGS. 7(a) through 7(c) and FIGS. 8(a) and 8(b). FIGS. 7(a) through 7(c) and FIGS. 8(a) and 8(b) are cross-sectional and plan views illustrating a method for fabricating a structure for holding a microstructure according to the first embodiment of the present invention.

Figure 7A:
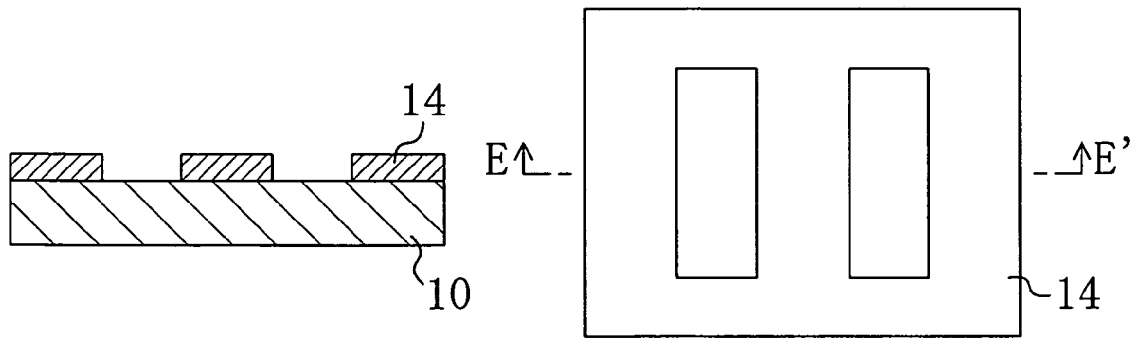
FIGS. 7(*a*) through 7(*c*) are cross-sectional and plan views illustrating a method for fabricating a structure for holding a microstructure according to a first embodiment of the present invention.

In a fabrication method according to this embodiment, first, as in a process step shown in FIG. 7(a), a hydrophobic film 14 is deposited over a silicon substrate 10. As the hydrophobic film 14, for example, a silicon nitride film is formed by CVD. A thickness of the silicon nitride film is preferably 10 nm or more, and is more preferably about 50-200 nm. This is because with the above-described thickness, functions as the hydrophobic film 14 can be efficiently exhibited. In this case, a silicon oxide film may be deposited as an underlying film under the silicon nitride film so that the hydrophobic film 14 has a laminated structure. Next, a resist mask (not shown) is formed over the hydrophobic film 14 by photolithography and then the hydrophobic film 14 is patterned by anisotropic etching. Thus, parts of the silicon substrate 10 in which V-shaped grooves 13 are to be formed are exposed. When a silicon nitride film is used as the hydrophobic film 14, anisotropic etching is performed using, for example, a mixture gas of $CF_4$ and $O_2$. Thereafter, a resist mask is removed by oxygen-based plasma etching.

Figure 7B:
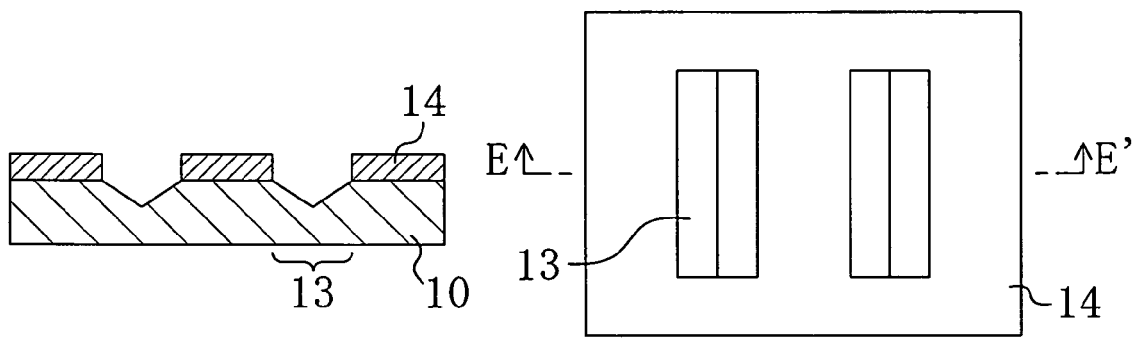

Next, in a process step shown in FIG. 7(b), etching is performed to the silicon substrate 10 with the hydrophobic film 14 used as a mask, thereby forming V-shaped grooves 13 in the silicon substrate 10. As a method for forming the V-shaped grooves 13 in the silicon substrate 10, for example, crystal anisotropic etching is used. In crystal anisotropic etching, an etching rate largely varies depending on crystal faces, and etching can be stopped in a crystal face where an etching rate is low. Specifically, for example, with a silicon substrate having a surface of a (100) plane used as the silicon substrate 10 and a strip-shaped opening formed in the hydrophobic film 14 so as to extend in parallel to a <110> orientation, crystal anisotropic etching is performed using a KOH 40% solution at 60° C., thereby forming the V-shaped grooves 13. As an etchant, not only a potassium hydroxide (KOH) solution but also ethylene diamine pyrochatecol (EDP), tetramethyl ammonium hydroxide (TMAH) or the like may be used.

Figure 7C:
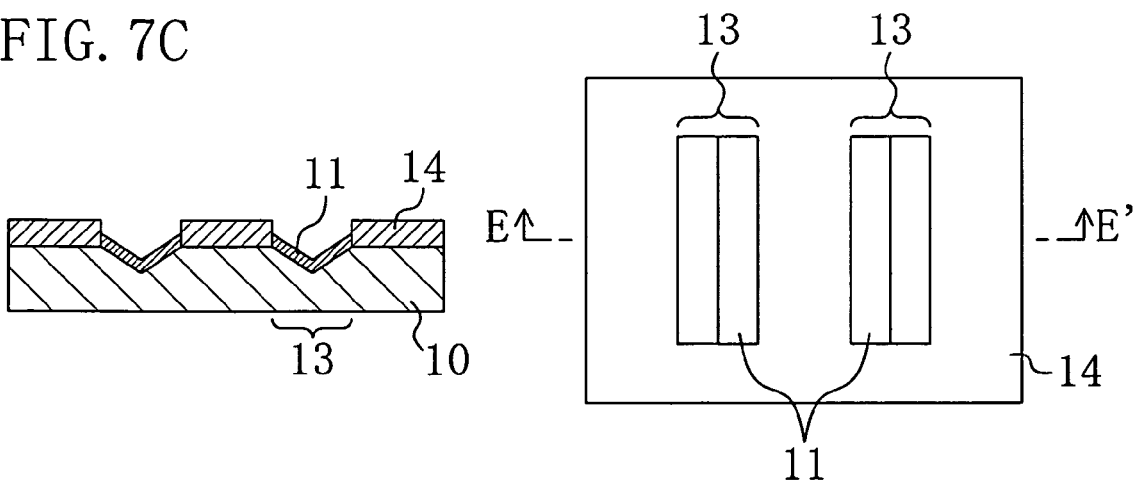

Next, in a process step shown in FIG. 7(c), a hydrophilic film 11 is formed in part of the silicon substrate 10 which is also a surface of each of the V-shaped grooves 13. In this embodiment, a silicon oxide film is formed as the hydrophilic film 11. The silicon oxide film is obtained by performing heat treatment to the silicon substrate 10 and depositing silicon oxide over the silicon substrate 10. Moreover, the hydrophilic film 11 preferably has a thickness of 1 nm or more. With a thickness of 1 nm or more, functions as the hydrophilic film 11 can be effectively exhibited.

Figure 8A:
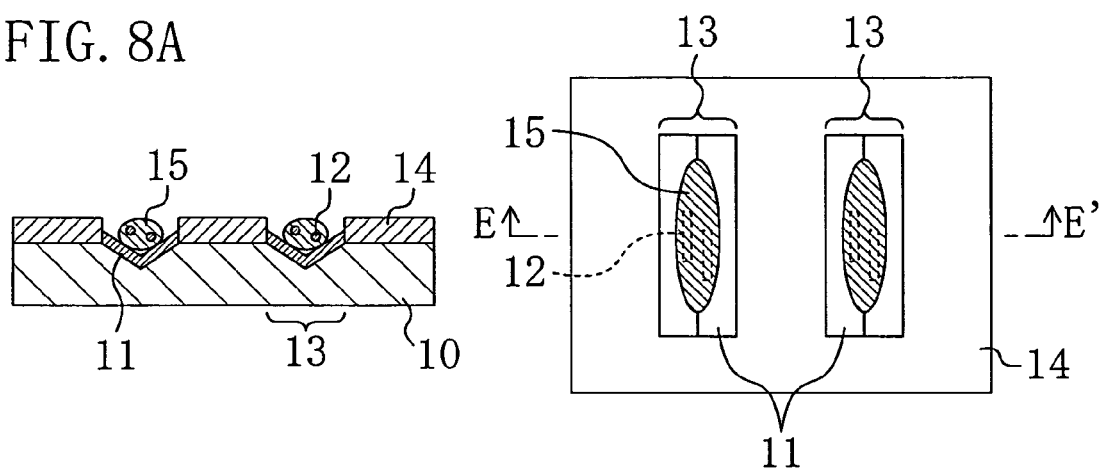
FIGS. 8(*a*) and 8(*b*) are cross-sectional and plan views illustrating a method for fabricating a structure for holding a microstructure according to the first embodiment of the present invention.

Next, in a process step shown in FIG. 8(a), for example, a nanowire disperse solution 15 is dropped, for example, by an inkjet technique, printing using a dispenser or screen printing, thereby selectively applying the nanowire disperse solution 15 into the V-shaped grooves 13. At this time, the hydrophilic film 11 has been formed on a surface of each of the V-shaped grooves 13 and the hydrophobic film 14 has been formed on a surface of other parts of the substrate 10 than the V-shaped grooves 13, so that the nanowire disperse solution 15 can be placed in the V-shaped grooves 13 in a more simple manner.

Hereafter, a method for forming the nanowire disperse solution 15 will be described. First, a substrate (not shown) is prepared and nanowires (not shown) of silicon are grown on the substrate by CVD. Next, the nanowires are collected from the substrate. The following is a method which allows efficient collections of the nanowires. For example, wires of silicon germanium are formed on a substrate by CVD and then a source gas is changed to another source gas, so that hetero growth of the silicon nanowires is performed. In this manner, a nanowire configuration in which a substrate is connected to a germanium portion is formed. Thereafter, for example, if the substrate is immersed in an etchant containing nitric acid, hydrogen fluoride and water at the ratio of 60:60:1, silicon germanium is selectively etched, so that nanowires of silicon can be collected. The nanowires collected in the above-described manner are put in a solvent and then, for example, ultrasound cleaning is performed, so that the nanowires can be dispersed in the solvent (nanowire disperse solution). As a solvent used in this case, for example, water, ether, benzene, ethyl acetate, chloroform, isopropyl alcohol, ethanol, acetone, toluene, diethyl ether, an aqueous solution into which a surfactant is mixed or the like is used.

Figure 8B:
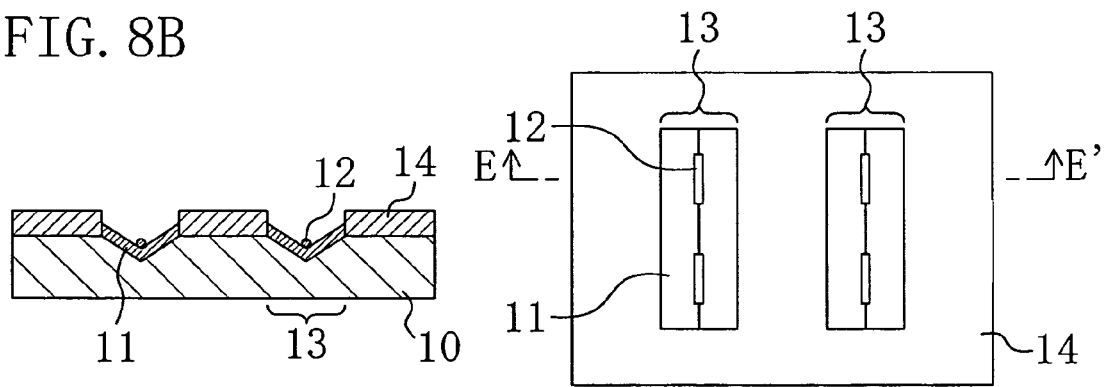

Next, in a process step of FIG. 8(b), the silicon substrate 10 is placed in heating equipment (not shown) or pressure reducing equipment (not shown). Then, a temperature of the heating equipment and a pressure of the pressure reducing equipment are controlled, so that the nanowire disperse solution 15 is evaporated. Thus, the nanowires 12 are arranged in the V-shaped grooves 13. In the course of this microstructure arrangement, two factors, i.e., lateral capillary force due to surface tension and force generated by fluid flow accompanying evaporation of a wet film affect. These two forces act in a balanced manner, so that the nanowires are arranged so as to extend along the longitudinal direction of the V-shaped grooves 13. Note that the nanowire disperse solution 15 may be evaporated due to spontaneous evaporation without using any heating equipment and pressure reducing equipment.

Figure 9A:
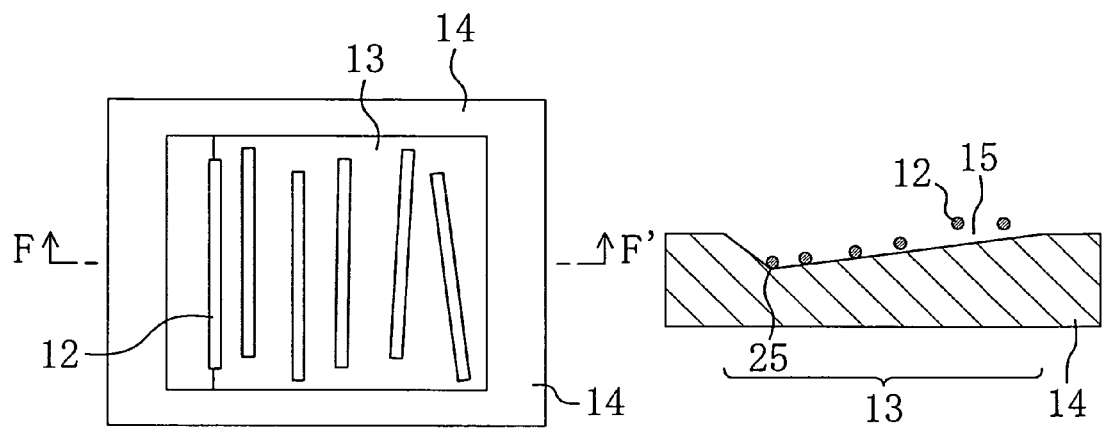
FIGS. 9(*a*) and 9(*b*) are views each illustrating arrangements for nanowires in a groove according to the first embodiment of the present invention.
Figure 9B:
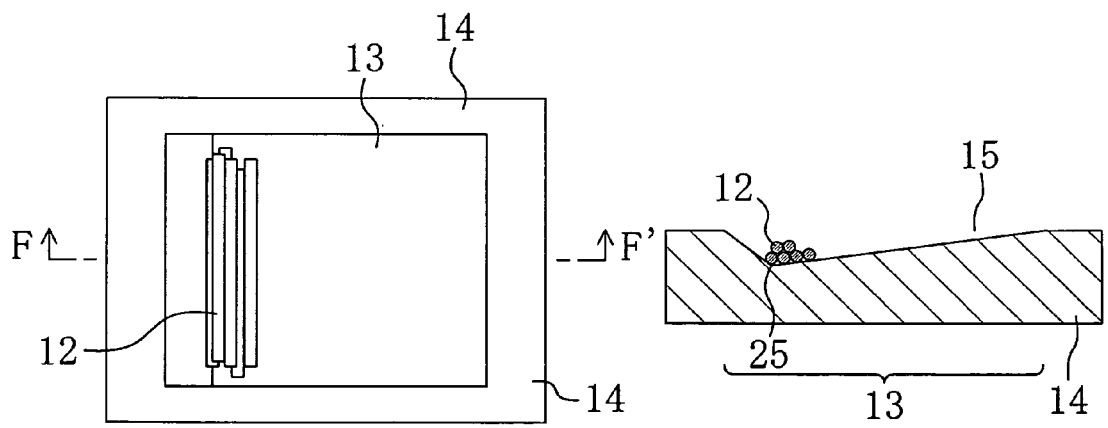

FIGS. 9(a) and 9(b) are views each illustrating arrangement for nanowires in a groove according to the first embodiment of the present invention. In FIGS. 9(a) and 9(b), the cases where a deepest portion 25 of a V-shaped groove 13 is shifted from the center of the V-shaped groove 13 are illustrated. As shown in FIG. 9(a), a plurality of nanowires 12 may be arranged so as to be dispersed in a single V-shaped groove 13. Also, as shown in FIG. 9(b), a plurality of nanowires 12 may be arranged so as to be appressed to one another around the deepest portion 25 of a single V-shaped groove 13.

As has been described above, according to the method for arranging nanowires according to this embodiment, nanowires can be arranged in a wide area with accuracy without using complicated equipment and process steps. Thus, industrial production of devices using nanowires becomes possible. Wettability with respect to the nanowire disperse solution is reduced in other part of the silicon substrate than part thereof in which the V-shaped groove is formed, compared to the surface of the V-shaped groove. Accordingly, the nanowires can be arranged only in desired locations (V-shaped groove regions).

Note that when lipid is used as the nanowire disperse solution 15, the surface of the V-shaped groove 13 is made to be lipophilic and lipophilic properties of a surface of other part of the substrate 10 than the V-shaped groove 13 is made lower than that of the surface of the V-shaped groove 13.

Second Embodiment

Figure 10A:
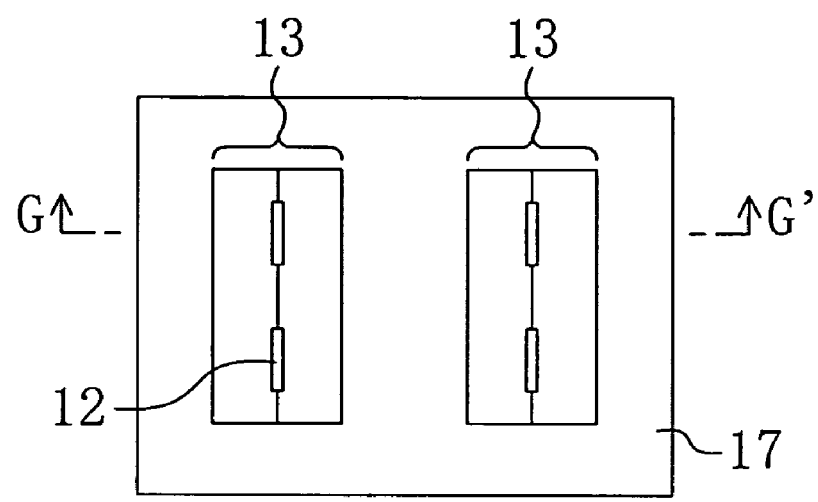
FIG. 10(*a*) is a plan view schematically illustrating a configuration of a structure for holding a microstructure according to a second embodiment of the present invention.
Figure 10B:
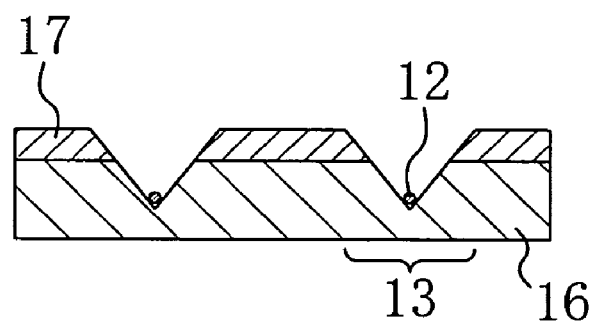

FIG. 10(a) is a plan view schematically illustrating a configuration of a structure for holding a microstructure according to a second embodiment of the present invention. FIG. 10(b) is a cross-sectional view taken along the line G-G' of FIG. 10(a).

In the structure for holding a microstructure according to this embodiment, nanowires 12 are arranged on a plastic substrate 16. As the plastic substrate 16, an arbitrary flexible substrate formed of a material such as acryl resin, epoxy resin and polyimide can be used. Note that in the structure shown in FIGS. 10(a) and 10(b), when other part of the plastic substrate 16 than a surface portion of each V-shaped groove 13 is covered by a hydrophilic film 17, lipid is used as a nanowire disperse solution. With use of lipid, the nanowire disperse solution can be selectively supplied into the V-shaped groove 13.

Figure 11A:
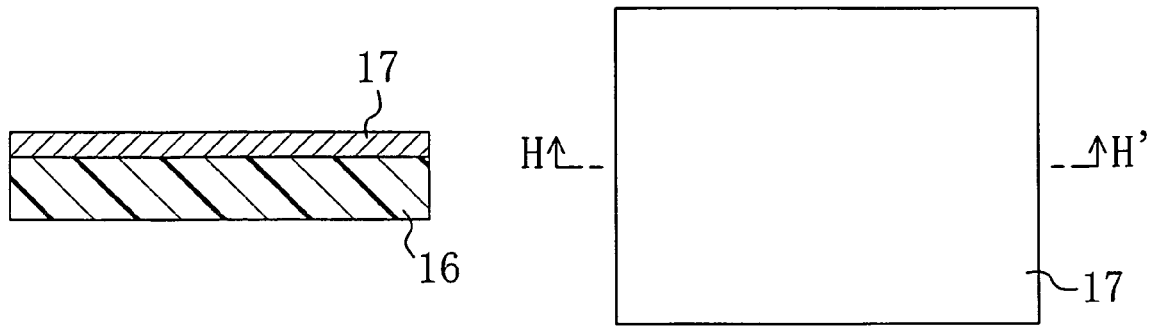
FIGS. 11(*a*) through 11(*c*) are cross-sectional and plan views illustrating a method for fabricating a structure for holding a microstructure according to the second embodiment of the present invention.
Figure 11B:
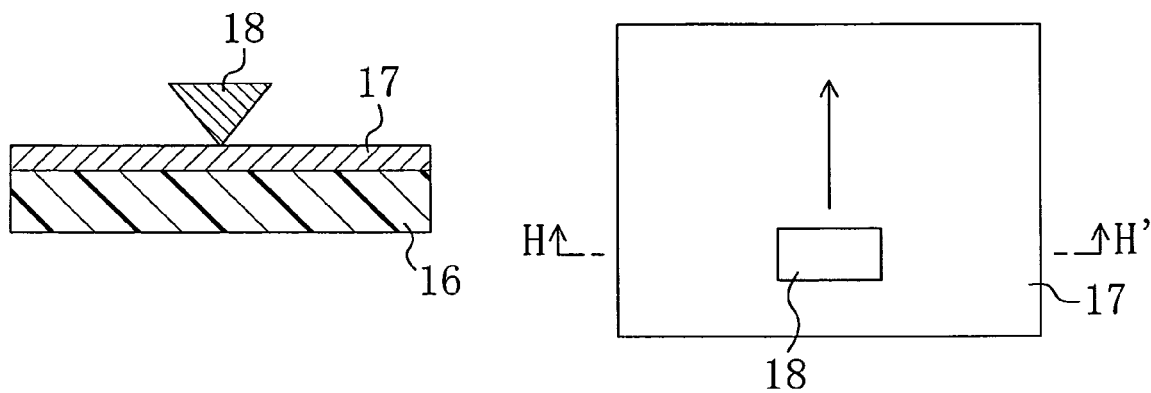

Hereafter, a fabrication method according to this embodiment will be described with reference to FIGS. 11(a) through 11(c). FIGS. 11(a) through 11(b) are cross-sectional and plan views illustrating a method for fabricating a structure for holding a microstructure according to the second embodiment of the present invention.

According to the fabrication method of this embodiment, first, in a process step shown in FIG. 11(a), a hydrophilic film 17 is deposited over the plastic substrate 16. For example, the hydrophilic film 17 is formed of a silicon oxide film and is obtained by film deposition using CVD or spin on glass (SOG). A thickness of the silicon oxide film is preferably 10 nm or more, and is more preferably about 50-200 nm. With the above-described thickness, functions as the hydrophilic film 17 can be efficiently exhibited.

Next, in a process step shown in FIG. 11(b), a nanoindenter such as a pyramid indenter 18 is pressed into the plastic substrate 16 from the hydrophilic film 17 and an XY stage of the pyramid indenter 18 is scanned.

Figure 11C:
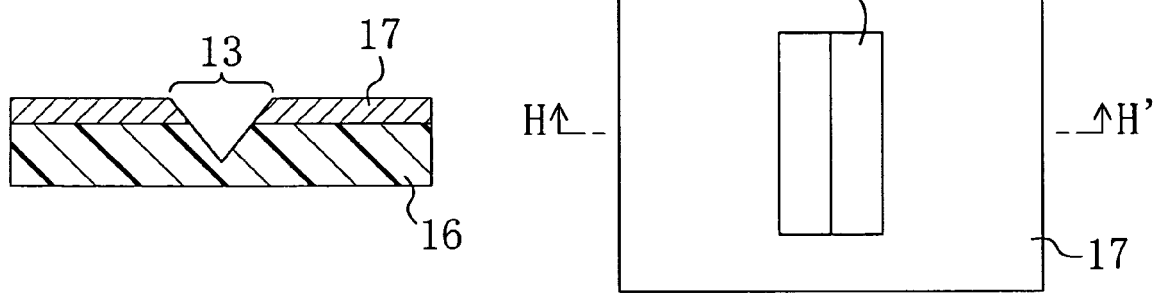

Then, in a process step shown in FIG. 11(c), application load to the moving pyramid indenter 18 is kept at a certain level and scratching by the pyramid indenter 18 is performed to the plastic substrate 16 to draw a line pattern thereon. The pyramid indenter 18 is shifted in the direction which the arrow in the plan view of the FIG. 11(b) points, so that a line pattern (V-shaped groove 13) can be formed. Thus, a V-shaped groove 13 can be formed on the substrate so as to be regularly arranged in a periodic manner. Note that as a method for forming the V-shaped groove 13, a method in which some other nanoindenter than the pyramid indenter 18 is pressed into the substrate or nanoimprint lithography may be used.

Note that a method for arranging nanowires in the V-shaped groove 13 used in this embodiment is the same as in the first embodiment except for use of lipid as a nanowire disperse solution.

In this embodiment, nanowires can be arranged in a wide area with accuracy without using complicated equipment and process steps. Thus, industrial production of devices using nanowires becomes possible. Compared to the surface of the V-shaped groove, wettability with respect to the nanowire disperse solution is reduced in other part of the silicon substrate than part thereof in which the V-shaped groove is formed. Accordingly, the nanowires can be arranged only in desired locations (V-shaped groove regions).

Third Embodiment

Figure 12A:
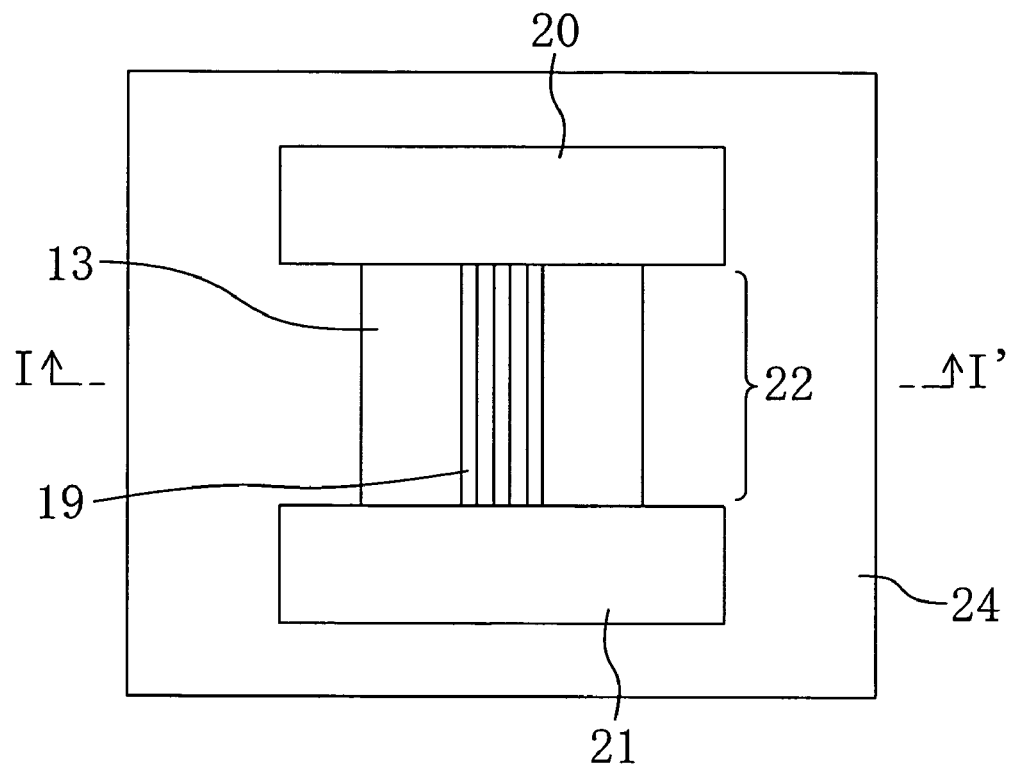
FIG. 12(*a*) is a schematic plan view of a field-effect transistor according to a third embodiment of the present invention.
Figure 12B:
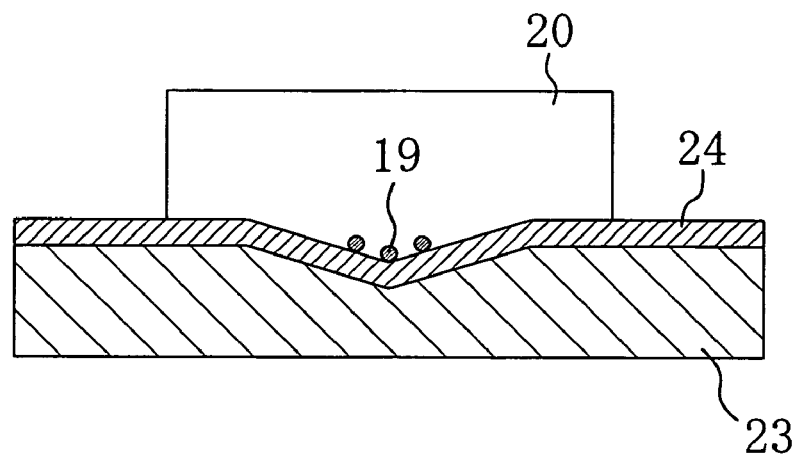

FIG. 12(a) is a schematic plan view of a field-effect transistor according to a third embodiment of the present invention. FIG. 12(b) is a cross-sectional view taken along the line I-I' of FIG. 12(b). The field-effect transistor of this embodiment uses either one of the structures for holding a microstructure described in the first and second embodiments.

As shown in FIGS. 12(a) and 12(b), the field-effect transistor includes a channel region 22 formed of a bunch of a plurality of nanowires 19 through which charged particles (electrons and holes) move. The nanowires 19 are arranged in a V-shaped groove 13 and electrically connected to a pair of electrodes 20 and 21 functioning as source/drain regions. The electrodes 20 and 21 are provided on a gate insulating film 24 and a gate electrode 23 is provided under the gate insulating film 24. In the field-effect transistor having the above-described structure, a potential of the gate electrode 23 is changed up and down using a driving circuit (not shown), thereby controlling a conductivity of the channel region 22 and executing a transistor operation.

Figure 13:
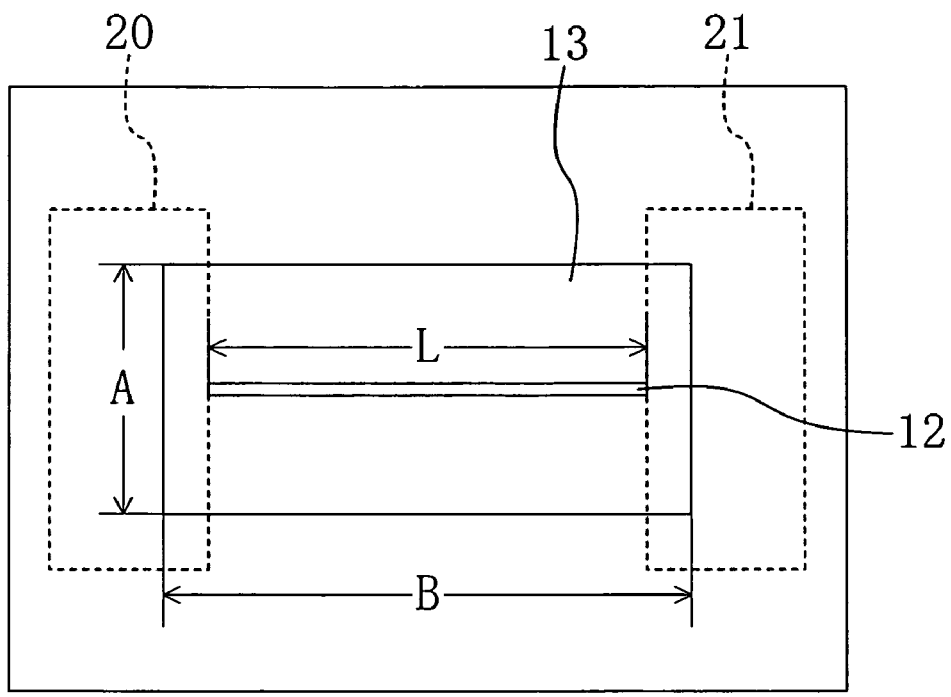
FIG. 13 is a schematic plan view showing the relationship between respective sizes of a nanowire and a V-shaped groove which are necessary for realizing the field-effect transistor of FIGS. 12(*a*) and 12(*b*).

FIG. 13 is a plan view showing the relationship between respective sizes of a nanowire and a V-shaped groove which are necessary for realizing the field-effect transistor of FIGS. 12(a) and 12(b). In FIG. 13, A denotes a length of a V-shaped groove 13 in a vertical direction to a longitudinal direction of the V-shaped groove 13, B denotes a length of the V-shaped groove 13 in the longitudinal direction and L denotes a length of a nanowire 12. With the relationship of L>A and L<B satisfied, the nanowire 12 can be arranged so as to extend in the longitudinal direction of the V-shaped groove 13. That is, the nanowire 12 is arranged in a self-aligning manner so as to extend along the longitudinal direction of the V-shaped groove 13 by making the length L of the nanowire 12 to be smaller than the length B of the V-shaped groove 13 in the longitudinal direction and larger than the length A of the V-shaped groove 13 in the vertical direction to the longitudinal direction.

Figure 14A:
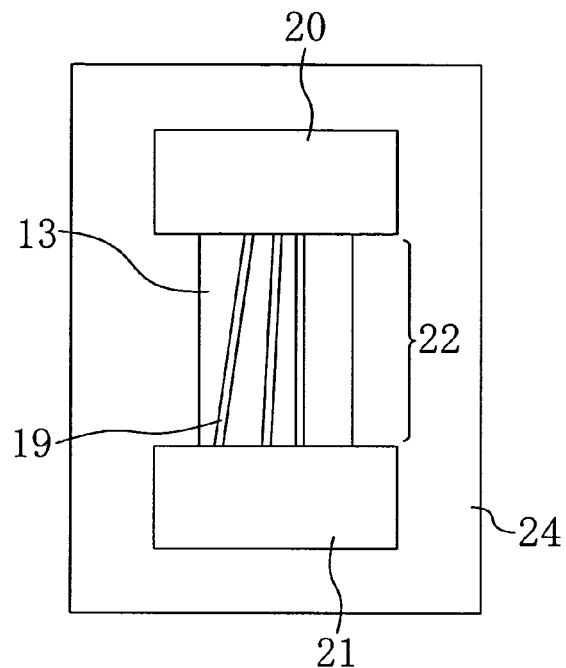
FIGS. 14(*a*) through 14(*c*) are schematic plan views illustrating exemplary arrangements for nanowires in the field-effect transistor according to the third embodiment of the present invention.
Figure 14B:
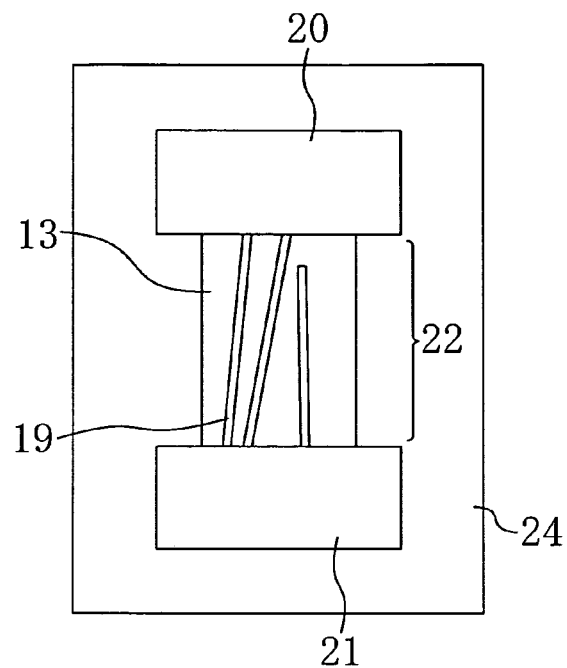
Figure 14C:
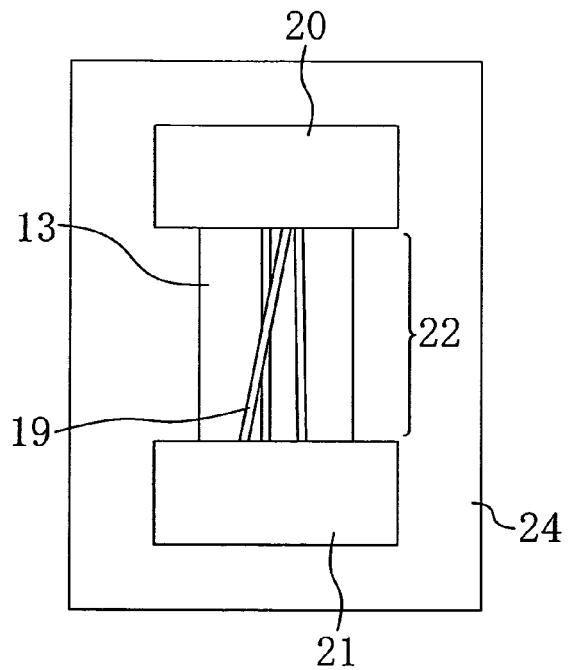

FIGS. 14(a) through 14(c) are schematic plan views illustrating exemplary arrangements for nanowires in the field-effect transistor according to the third embodiment of the present invention. In this embodiment, as shown in FIG. 14(a), there may be some of nanowires 19 which are not arranged in parallel to the longitudinal direction of the V-shaped groove 13 and, also, as shown in FIG. 14(b), there may be some of the plurality of nanowires 19 which do not reach the electrode 20 or 21. Moreover, as shown in FIG. 14(c), the nanowires 19 may intersect with one another.

Figure 15A:
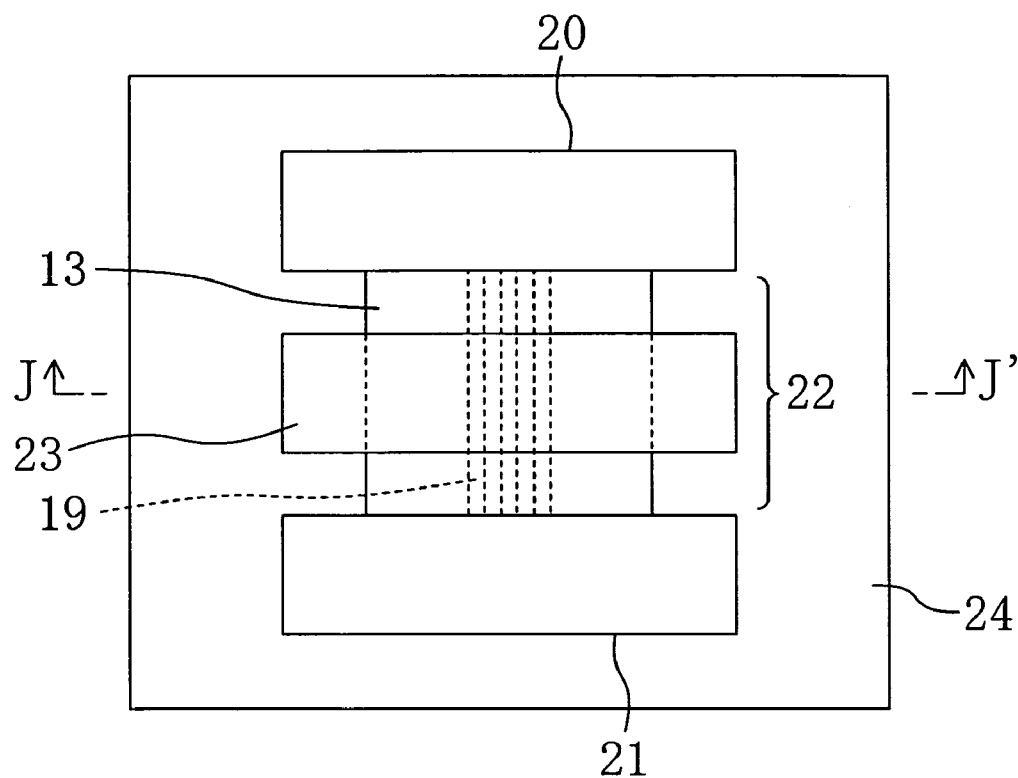
FIGS. 15(*a*) and 15(*b*) are plan and cross-sectional views schematically illustrating a configuration of a top-gate type field-effect transistor.
Figure 15B:
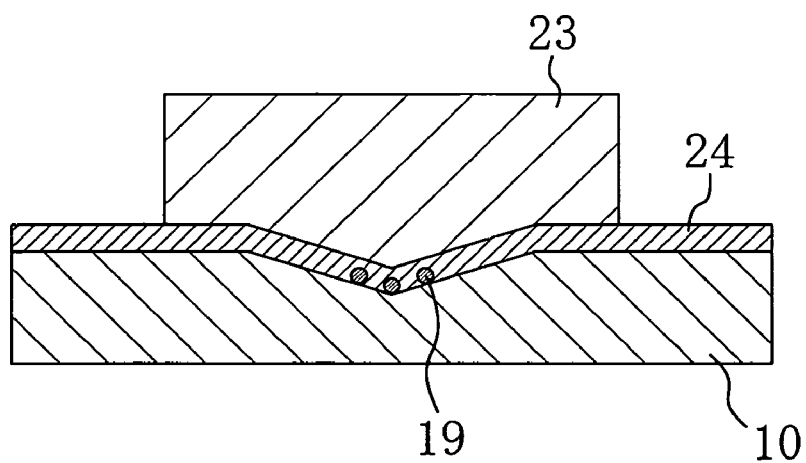

Note that the field-effect transistor of this embodiment may be the following top-gate type field-effect transistor. FIGS. 15(a) and 15(b) are plan and cross-sectional views schematically illustrating a configuration of a top-gate type field-effect transistor. In the field-effect transistor shown in FIGS. 15(a) and 15(b), electrodes 20 and 21 functioning as source/drain regions are provided on a silicon substrate 10 and a gate electrode 23 is provided in a region of the silicon substrate 10 between the electrodes 20 and 21 with a gate insulating film 24 interposed between the silicon substrate 10 and the gate electrode 23. On the silicon substrate 10, nanowires 19 for electrically connecting the electrodes 20 and 21 are provided. Note that under the gate electrode 23, the nanowires 19 are provided in the gate insulating film 24.

In a known technique, nanowires are arranged with respect to an alignment mark on a substrate and then source/drain regions are formed so as to align according to the alignment mark. In contrast, in the field-effect transistor of this embodiment, the nanowires 19 can be arranged in the longitudinal direction to the V-shaped groove 13, so that a channel region of the field-effect transistor can be defined by forming a groove in an arbitrary location. Therefore, compared to the known technique, a deviation between respective locations of the channel region and the source/drain regions can be reduced. Accordingly, the size of the semiconductor device can be reduced.

Figure 16A:
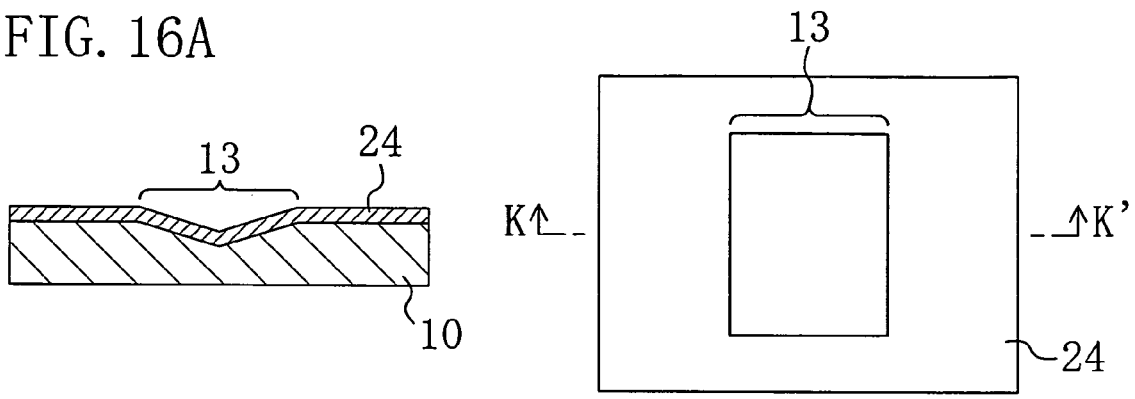
FIGS. 16(*a*) through 16(*c*) are cross-sectional and plan views illustrating a method for fabricating the field-effect transistor according to the third embodiment of the present invention.
Figure 16B:
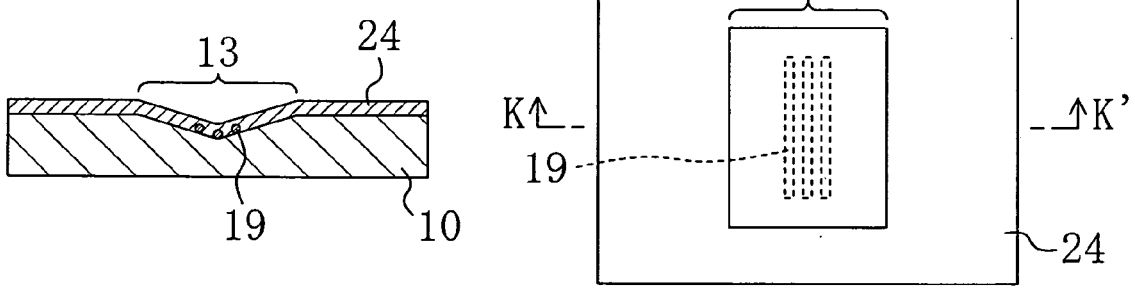
Figure 16C:
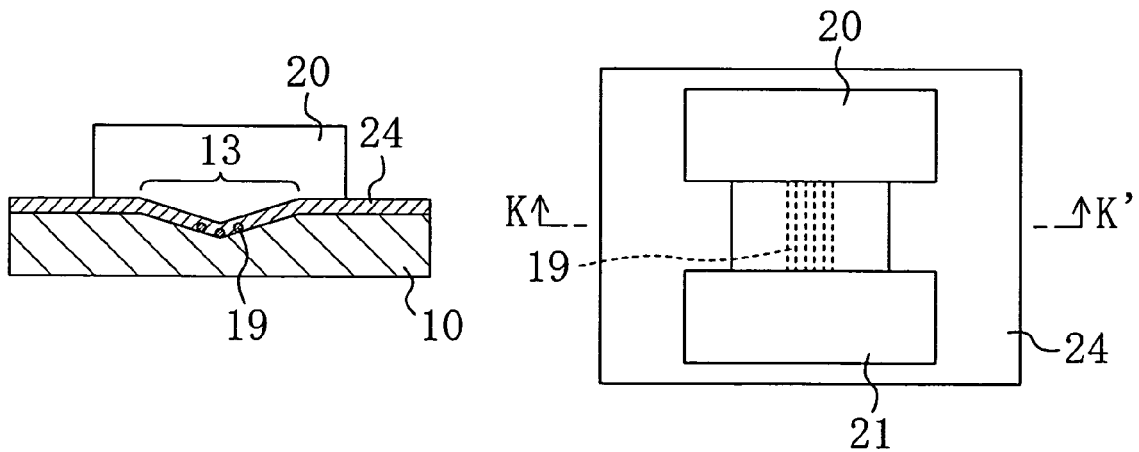

Hereafter, a method for fabricating a back-gate type field-effect transistor according to this embodiment will be described with reference to FIGS. 16(a) through 16(c). FIGS. 16(a) through 16(c) are cross-sectional and plan views illustrating a method for fabricating the field-effect transistor according to the third embodiment of the present invention.

In the fabrication method of this embodiment, first, in a process step shown in FIG. 16(a), a V-shaped groove 13 is formed in an upper portion of a silicon film 26 which has been doped with an impurity into the p-type and a gate insulating film 24 is deposited over the silicon film 26. Note that the V-shaped groove 13 can be formed by either one of the methods described in the first and second embodiments.

Next, in a process step shown in FIG. 16(b), nanowires 19 can be arranged so as to extend in a longitudinal direction of the V-shaped groove 13. Note that the nanowires 19 can be arranged by the method described in the first embodiment.

Next, in a process step shown in FIG. 16(c), electrodes 20 and 21 for functioning as source/drain regions are formed on the gate insulating film 24 so as to cover the V-shaped groove 13. As the electrodes 20 and 21, for example, silicide made of a metal such as gold, silver, platinum, titanium, cobalt and nickel is preferably formed.

Fourth Embodiment

Figure 17A:
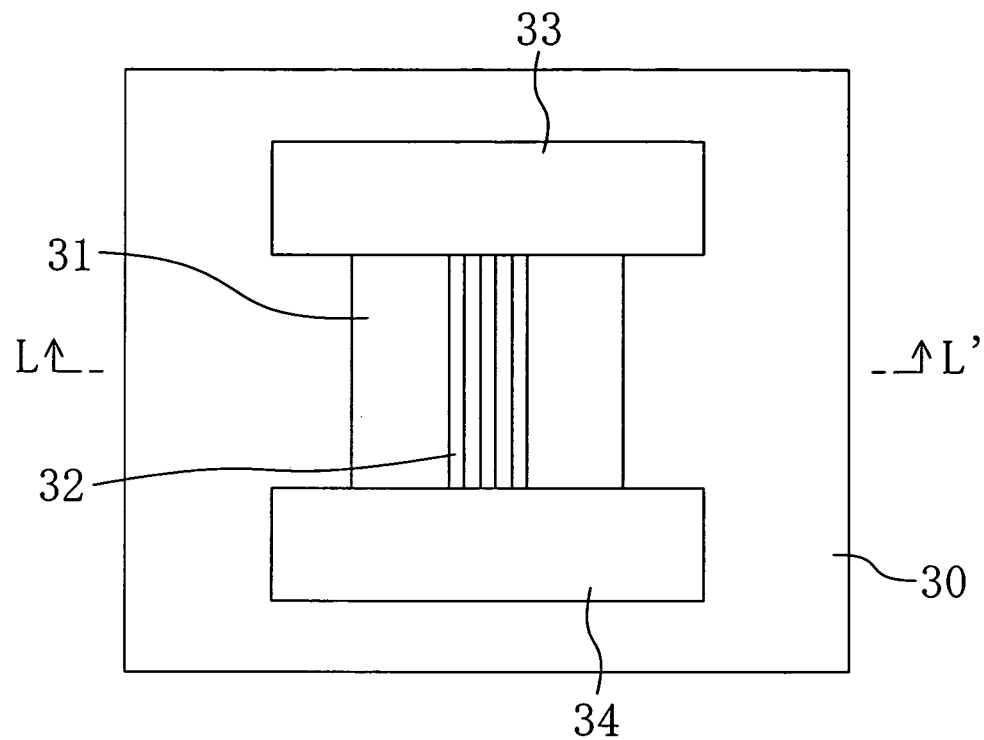
FIG. 17(*a*) is a plan view illustrating a configuration of a sensor according to a fourth embodiment of the present invention.
Figure 17B:
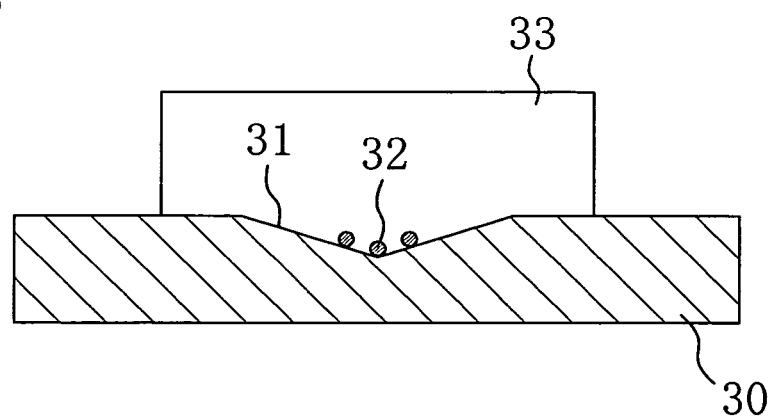

FIG. 17(a) is a plan view illustrating a configuration of a sensor according to a fourth embodiment of the present invention. FIG. 17(b) is a cross-sectional view taken along the line L-L'. The sensor of this embodiment uses either one of the structures for holding a microstructure described in the first and second embodiments.

As shown in FIGS. 17(a) and 17(b), in the sensor of this embodiment, a groove 31 having a V-shaped cross-sectional view is formed in an insulating substrate 30. Nanowires 32 are arranged in the groove 31 and both ends of each of the nanowires 32 are connected to two electrodes 33 and 34 formed on the insulating substrate 30, respectively. As the insulating substrate 30, for example, a plastic substrate formed of a material such as acryl resin and polyimide, a glass substrate or like substrate is used.

In the sensor of this embodiment, when a substance to be detected absorbs to the nanowires 32, a conductance of the nanowires 32 is changed. The amount of the substance to be detected can be identified by detecting an amount of change in the conductance by the electrodes 33 and 34. Such a sensor can be used as a gas sensor or a biosensor.

Figure 18:
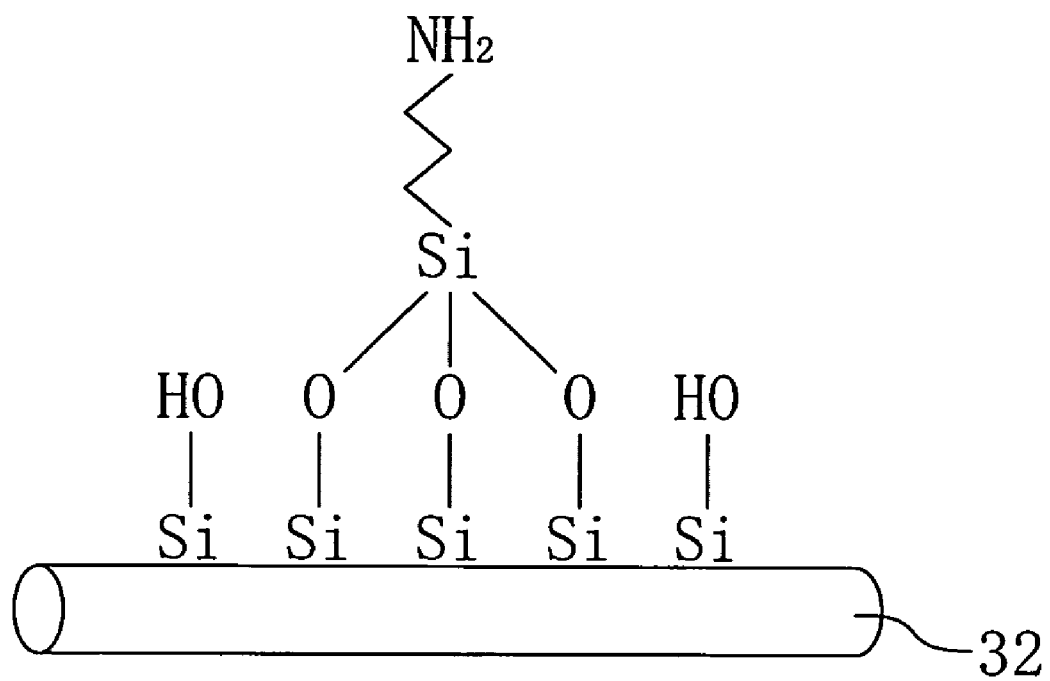
FIG. 18 is a view illustrating an example where a nanowire is chemically modified.

When the nanowires 32 having the structure shown in FIGS. 17(a) and 17(b) are chemically modified with aminosilane, the nanowires 32 can be used as a pH sensor. FIG. 18 is a view illustrating an example where a nanowire is chemically modified. In the structure shown in FIG. 18, a nanowire of silicon is used as each of the nanowires 32. OH groups are bonded to silicon located on a surface of the nanowires 32. Si of aminosilane is bound to several Os of OH groups. In this structure, when pH is low, amino groups which indicates basicity accept hydrogen ions to generate a base. When pH is high, $H^+$ ions desorb from OH groups bound to the surface of each of the nanowires 32. As a result, in each of the case where pH is high and the case where pH is low, the conductance of the nanowires 32 is changed.

Note that chemical modification shown in FIG. 18 can be achieved by the following fabrication method. First, UV ozonization is performed to the nanowires 32 to activate the surface of the nanowires 32. Next, the nanowires 32 are immersed in a surface processing solution containing aminosilane and then heat processing is performed at about 100° C. to combine the surface of the nanowires 32 with aminosilane. Thereafter, electrodes 33 and 34 which are to be connected to both ends of each of the nanowires 32 are formed on the insulating substrate 30.

Note that in FIG. 18, the case where the nanowires 32 are chemically modified with aminosilane has been described but, instead of an amino group, a functional group such as a carboxyl group and a mercapto group which exhibits a strong polar character may be introduced. In this case, the conductance of the nanowires is changed by absorption or desorption of a substance to be detected due to electrostatic interactions, and thus the substance to be detected can be quantified. As a substance with which the nanowires are chemically modified, besides aminosilane, mercaptosilane or the like can be used.

A nanowire has a large surface area and thus its conductivity largely varies depending on its surface state. Therefore, with a nanowire is used for a sensor, a highly precise sensor can be achieved.

Other Embodiments

A structure for holding a microstructure according to the present invention is applicable not only to the MOS transistors and sensors which have been described above but also to semiconductor devices such as a bipolar transistor and a resistance element. When the structure of the present invention is used for a bipolar transistor, an emitter electrode and a collector electrode can be connected by a microstructure. When the structure of the present invention is used for a resistance element, a first electrode and a second electrode can be electrically connected.

Figure 19:
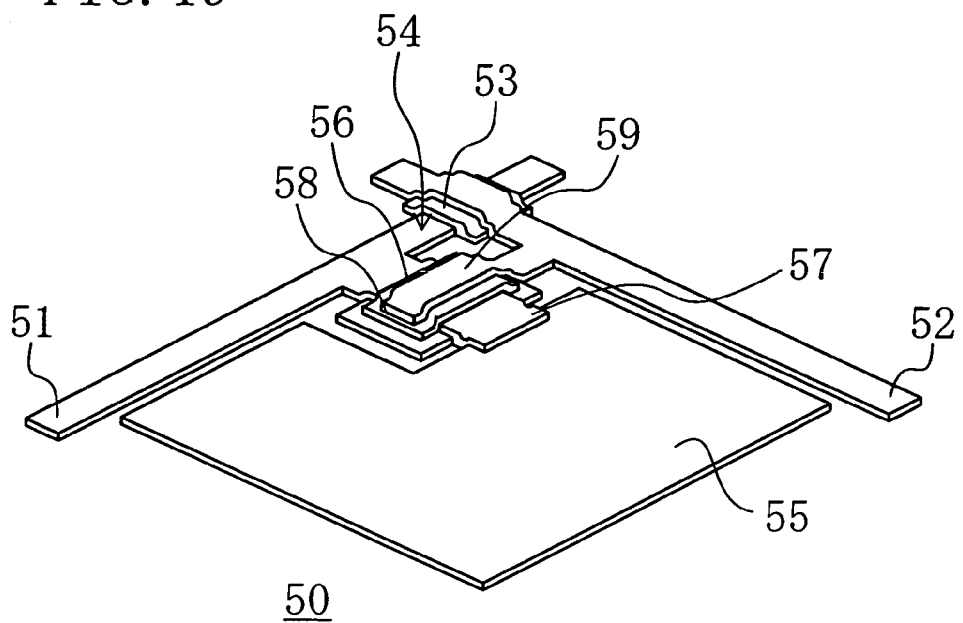
FIG. 19 is a view schematically illustrating a configuration of a TFT driving circuit when a structure according to the present invention is used as a TFT.

The above-described MOS transistor of the present invention can be used as a TFT. FIG. 19 is a view schematically illustrating a configuration of a TFT driving circuit when a structure according to the present invention is used as a TFT. In the structure shown in FIG. 19, a source electrode line 51 and a gate electrode line 52 are provided on a substrate 50 so as to perpendicularly intersect one another with an insulating film 53 interposed between the source electrode line 51 and the gate electrode line 52. A TFT 54 and a pixel electrode 55 of an organic EL material are formed in each of regions of the substrate 50 divided by the source electrode line 51 and the gate electrode line 52. The TFT 54 includes a source electrode 56 connected to the source electrode line 51, a drain electrode 57 connected to the pixel electrode 55, a gate insulating film 58 provided between the source electrode 56 and the drain electrode 57 and a gate electrode 59 formed on the gate insulating film 58 so as to be connected to the gate electrode line 52. Although not shown in FIG. 19, a nanowire for connecting the source electrode 56 and the drain electrode 57 is provided under or in the gate insulating film 58.

The structure of the present invention can be formed using a flexible substrate. Therefore, the structure is particularly useful when the structure is used for the TFT shown in FIG. 19.

Figure 20:
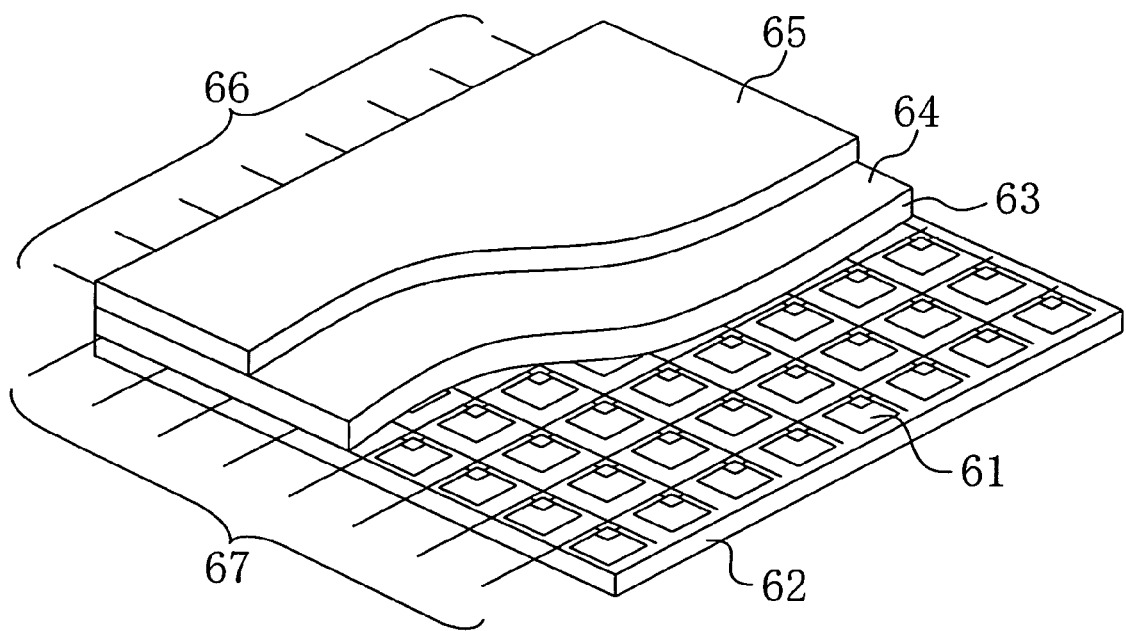
FIG. 20 is a view schematically illustrating a configuration of an organic EL panel using a TFT according to the present invention.

Note that the TFT of FIG. 19 can be used for a panel shown in FIG. 20. FIG. 20 is a view schematically illustrating a configuration of an organic EL panel using a TFT according to the present invention. The structure shown in FIG. 20 includes a plastic substrate 62 on which TFT driving circuits 61 are arranged in a matrix, an organic EL layer 63 provided over the plastic substrate 62, a transparent electrode 64 formed on the organic EL layer 63 and a protective film 65 provided on the transparent electrode 64. Note that each of the TFT driving circuits 61 is connected to an associated one of gate electrode lines 66 and an associated one of source electrode lines 67.

Note that the organic EL panel has been described in the description above. However, an inorganic EL may be used. Also, an EL made of a composite material containing an organic material and an inorganic material may be used.

INDUSTRIAL APPLICABILITY

The present invention has high industrial applicability in the point that a microstructure such as a nanowire can be formed at low cost and in an industrial scale.

The invention claimed is:

1. A method for fabricating a structure holding a microstructure, the method comprising the steps of:
    a) supplying a fluid containing a microstructure having a cylindrical shape in at least one anisotropic groove provided on a substrate; and
    b) evaporating the fluid so that the microstructure is arranged so as to extend in a longitudinal direction of said at least one anisotropic groove,
    the method further comprising, before the step a), the step c) of forming said at least one anisotropic groove, and
    after the step c) and before the step a), the step d) of increasing an affinity with respect to the fluid in a surface of said at least one anisotropic groove to a higher level than an affinity in a surface of the substrate excluding part of the substrate in which said at least one anisotropic groove is formed, wherein:
    in the step d), the affinity with respect to the fluid is increased in the surface of said at least one anisotropic groove to a higher level than the affinity in the surface of the substrate excluding part of the substrate in which said at least one anisotropic groove is formed by covering, with a first coating film, the part of the substrate in which said at least one anisotropic groove is formed and covering, with a second coating film, the part of the substrate excluding the part of the substrate in which said at least one anisotropic groove is formed,
    in the step c), said at least one anisotropic groove is formed by etching the substrate using a hydrophobic film formed on the substrate as a mask, the hydrophobic film being used as the second coating film, and
    in the step d), a hydrophilic film used as the first coating film is formed on the surface of said at least one anisotropic groove.

2. The method of claim 1, wherein in the step d), the affinity with respect to the fluid is increased in the surface of said at least one anisotropic groove to a higher level than the affinity in the surface of the substrate excluding the part of the substrate in which said at least one anisotropic groove is formed by covering, with a coating film, the part of the surface of the substrate in which said at least one anisotropic groove is formed.

3. The method of claim 1, wherein in the step a), the fluid is supplied using selective deposition.

4. The method of claim 3, wherein in the step a), the fluid is supplied using an inkjet technique.

5. The method of claim 1, wherein in the step c), said at least one anisotropic groove is formed using imprint lithography.

6. A method for fabricating a semiconductor device which includes the method of claim 1, further comprising the step e) of forming a first electrode and a second electrode which are to be connected to the microstructure.

7. A method for fabricating a semiconductor device which includes the method of claim 6, wherein in the step e), a source electrode is formed as the first electrode and a drain electrode is formed as the second electrode, and
    wherein the method further includes the steps of:
    forming a gate insulating film for covering the microstructure on the substrate; and
    forming a gate electrode on the gate insulating film.

8. A method for fabricating a sensor which includes the method of claim 1, wherein the substrate is an insulating substrate, and
    wherein the method further includes the step of forming a first electrode and a second electrode which are to be connected to the microstructure.

9. A method for fabricating a sensor which includes the method of claim 8, further comprising the step of chemically modifying a surface of the microstructure.

10. The method of claim 1, wherein in the step b), the microstructure is arranged so as to extend in the longitudinal direction of said at least one anisotropic groove by evaporating the fluid containing the microstructure and thereby making a lateral capillary force due to surface tension and a force generated by a fluid flow accompanying evaporation of a wet film act on the microstructure.

11. A method for fabricating a structure holding a microstructure, the method comprising the steps of:
   a) supplying a fluid containing a microstructure having a cylindrical shape in at least one anisotropic groove provided on a substrate; and
   b) evaporating the fluid so that the microstructure is arranged so as to extend in a longitudinal direction of said at least one anisotropic groove,
   the method further comprising, before the step a), the step c) of forming said at least one anisotropic groove, and
   after the step c) and before the step a), the step d) of increasing an affinity with respect to the fluid in a surface of said at least one anisotropic groove to a higher level than an affinity in a surface of the substrate excluding part of the substrate in which said at least one anisotropic groove is formed, wherein:
   in the step d), the affinity with respect to the fluid is increased in the surface of said at least one anisotropic groove to a higher level than the affinity in the surface of the substrate excluding the part of the substrate in which said at least one anisotropic groove is formed by covering, with a coating film, part of the substrate excluding the part of the substrate in which said at least one anisotropic groove is formed,
   in the step c), after formation of a hydrophilic film on the substrate, said at least one anisotropic groove is formed by removing the hydrophilic film together with the substrate, and the hydrophilic film remains on part of the substrate at which said at least one anisotropic groove is not formed thereby serving as the coating film, and
   in the step a), a lipid fluid containing the microstructure is supplied in the at least one anisotropic groove.

12. The method of claim 11, wherein in the step d), the affinity with respect to the fluid is increased in the surface of said at least one anisotropic groove to a higher level than the affinity in the surface of the substrate excluding the part of the substrate in which said at least one anisotropic groove is formed by covering, with a coating film, the part of the surface of the substrate in which said at least one anisotropic groove is formed.

13. The method of claim 11, wherein in the step a), the fluid is supplied using selective deposition.

14. The method of claim 13, wherein in the step a), the fluid is supplied using an inkjet technique.

15. The method of claim 11, wherein in the step c), said at least one anisotropic groove is formed using imprint lithography.

16. A method for fabricating a semiconductor device which includes the method of claim 11, further comprising the step e) of forming a first electrode and a second electrode which are to be connected to the microstructure.

17. A method for fabricating a semiconductor device which includes the method of claim 16, wherein in the step e), a source electrode is formed as the first electrode and a drain electrode is formed as the second electrode, and
   wherein the method further includes the steps of:
   forming a gate insulating film for covering the microstructure on the substrate; and
   forming a gate electrode on the gate insulating film.

18. A method for fabricating a sensor which includes the method of claim 11, wherein the substrate is an insulating substrate, and
   wherein the method further includes the step of forming a first electrode and a second electrode which are to be connected to the microstructure.

19. A method for fabricating a sensor which includes the method of claim 18, further comprising the step of chemically modifying a surface of the microstructure.

20. The method of claim 11, wherein in the step b), the microstructure is arranged so as to extend in the longitudinal direction of said at least one anisotropic groove by evaporating the fluid containing the microstructure and thereby making a lateral capillary force due to surface tension and a force generated by a fluid flow accompanying evaporation of a wet film act on the microstructure.

* * * * *

UNITED STATES PATENT AND TRADEMARK OFFICE
CERTIFICATE OF CORRECTION

PATENT NO.        : 7,772,125 B2
APPLICATION NO.   : 11/631284
DATED             : August 10, 2010
INVENTOR(S)       : Kawashima et al.

Page 1 of 1

It is certified that error appears in the above-identified patent and that said Letters Patent is hereby corrected as shown below:

Specifically, in Item (86) the PCT No. reads PCT/JP2006/030218 but should read PCT/JP2006/302180.

Signed and Sealed this
Eighteenth Day of January, 2011

David J. Kappos
*Director of the United States Patent and Trademark Office*